United States Patent
Gurpinar et al.

(10) Patent No.: US 9,619,592 B2
(45) Date of Patent: Apr. 11, 2017

(54) ANALYSIS OF ENHANCED OIL RECOVERY (EOR) PROCESSES FOR NATURALLY-FRACTURED RESERVOIRS

(71) Applicant: Schlumberger Technology Corporation, Sugar Land, TX (US)

(72) Inventors: Omer Gurpinar, Denver, CO (US); Jaime Moreno Ortiz, Perth (AU); YunLong Liu, Beijing (CN)

(73) Assignee: Schlumberger Technology Corporation, Sugar Land, TX (US)

( * ) Notice: Subject to any disclaimer, the term of this patent is extended or adjusted under 35 U.S.C. 154(b) by 837 days.

(21) Appl. No.: 14/012,064

(22) Filed: Aug. 28, 2013

(65) Prior Publication Data

US 2014/0067347 A1   Mar. 6, 2014

Related U.S. Application Data

(60) Provisional application No. 61/695,992, filed on Aug. 31, 2012.

(51) Int. Cl.
| | | |
|---|---|---|
| *G06G 7/48* | (2006.01) | |
| *G06F 17/50* | (2006.01) | |
| *G01V 99/00* | (2009.01) | |
| *E21B 43/16* | (2006.01) | |

(52) U.S. Cl.
CPC .......... *G06F 17/5009* (2013.01); *E21B 43/16* (2013.01); *G01V 99/005* (2013.01); *G01V 2210/624* (2013.01)

(58) Field of Classification Search
CPC ... G06F 17/5009; E21B 43/16; G01V 99/005; G01V 2210/624

USPC ................................................. 703/2, 9–10
See application file for complete search history.

(56) References Cited

U.S. PATENT DOCUMENTS

| | | |
|---|---|---|
| 6,980,940 B1 | 12/2005 | Gurpinar et al. |
| 7,478,024 B2 | 1/2009 | Gurpinar et al. |
| 8,311,743 B2 | 11/2012 | Gurpinar |
| 2003/0225606 A1* | 12/2003 | Raghuraman .......... G01V 11/00 705/7.28 |

(Continued)

FOREIGN PATENT DOCUMENTS

| | | |
|---|---|---|
| DE | 129035 | 2/1902 |
| WO | 2007018909 | 2/2007 |

OTHER PUBLICATIONS

Babadagli, "Selection of proper enhanced oil recovery fluid for efficient matrix recovery in fractured oil reservoirs" Elsevier Colloids and Surfaces A: Physicochem. Eng. Aspects 223 (2003) 157_/175. Department of Civil and Env. Eng., School of Mining and Petroleum, University of Alberta, 215 B Civil Engineering Bldg, Edmonton, Alta., Canada T6G 2G.*

(Continued)

*Primary Examiner* — Saif Alhija
(74) *Attorney, Agent, or Firm* — Mitchell M. Blakely

(57) ABSTRACT

A method, apparatus, and program product generate an estimation of an incremental recovery for an Enhanced Oil Recovery (EOR) process performed on a naturally-fractured reservoir by classifying the naturally-fractured reservoir based upon a set of reservoir properties associated with the naturally-fractured reservoir, and generating an estimation of the incremental recovery for at least one EOR process based on the classification of the naturally-fractured reservoir.

17 Claims, 21 Drawing Sheets

(56) References Cited

U.S. PATENT DOCUMENTS

| | | |
|---|---|---|
| 2005/0043891 A1 | 2/2005 | Bush |
| 2005/0149307 A1 | 7/2005 | Gurpinar et al. |
| 2007/0143025 A1* | 6/2007 | Valdez .................. E21B 43/16 |
| | | 702/13 |
| 2007/0298479 A1 | 12/2007 | Larter et al. |
| 2009/0065253 A1 | 3/2009 | Suarez-Rivera et al. |
| 2010/0004865 A1 | 1/2010 | Gurpinar |
| 2010/0108316 A1 | 5/2010 | England et al. |

OTHER PUBLICATIONS

International Search Report and Written Opinion of PCT Application No. PCT/US2009/048578 (110.0172PCT) dated Aug. 13, 2009: pp. 1-6.

International Search Report and Written Opinion of PCT Application No. PCT/US2013/057271 (IS122927WO) dated Dec. 3, 2013: pp. 1-14.

Covell et al., "Paper 140: The Chemistry of Extractives from Hardwoods. Part XXXI. 2-Acetyl-1,8-dihydroxy-3-methylnaphthalene (musizin), a Constituent of Maesopsis eminii," Journal of the Chemical Society (Resumed), 1961, Issue 0: pp. 702-706.

\* cited by examiner

| FRACTURE TYPE | MATRIX | | | FRACTURE | | |
|---|---|---|---|---|---|---|
| FD (1) | LOW STORATIVITY | LOW CONDUCTIVITY | LIMITED EOR POTENTIAL | HIGH STORATIVITY | HIGH CONDUCTIVITY | EOR LIMITED FRACTURES ONLY |
| FMD (2) | MID STORATIVITY | LOW CONDUCTIVITY | MODERATE EOR POTENTIAL | MID STORATIVITY | HIGH CONDUCTIVITY | MODERATE EOR POTENTIAL - SUBJECT TO MATRIX-FRACTURE INTERACTION |
| MFD (3) | HIGH STORATIVITY | MID CONDUCTIVITY | HIGH EOR POTENTIAL | LOW STORATIVITY | MID CONDUCTIVITY | HIGH EOR POTENTIAL |
| MD (4) | HIGH STORATIVITY | HIGH CONDUCTIVITY | HIGH EOR POTENTIAL | LOW STORATIVITY | LOW CONDUCTIVITY | HIGH EOR POTENTIAL - MATRIX DOMINATED |

FIG. 14

| FRACTURE TYPE | M-F | MODEL | PROCESS | MACROSCALE | MLDE | FLDE | GD | |
|---|---|---|---|---|---|---|---|---|
| FD (1) | FD_F TREAT AS SINGLE POROSITY FRACTURES | DPSP | DISP IN FRACTURES | WORKFLOW A | LOW WEIGHT | HIGH WEIGHT | LOW PRIORITY | EOR LIMITED TO FRACTURES ONLY |
| | | DPDP | DISP IN FRACTURES | WORKFLOW A | LOW WEIGHT | HIGH WEIGHT | LOW PRIORITY | |
| | FD_M TREAT AS DUAL POROSITY | DPSP | DISP IN FRACTURES GD | | MID WEIGHT | MID WEIGHT | MID PRIORITY | FRACTURES DOMINATE EOR SELECTION |
| | | DPDP | DISP IN FRACTURES GD | | MID WEIGHT | MID WEIGHT | MID PRIORITY | |
| FMD (2) | FMD_F TREAT AS DUAL POROSITY | DPSP | DISP IN FRACTURES GD | | MID WEIGHT | MID WEIGHT | HIGHER PRIORITY | MODERATE EOR PORTENTIAL - GRAVITY DRAINAGE, FRACTURES CHANNELING POTENTIAL |
| | | DPDP | DISP IN FRACTURES GD | | MID WEIGHT | MID WEIGHT | HIGHER PRIORITY | |
| | FMD_M TREAT AS DUAL POROSITY | DPSP | DISP/GD M+F | WORKFLOW B | HIGH WEIGHT | MID WEIGHT | HIGHER PRIORITY | FRACTURES DOMINATE EOR SELECTION |
| | | DPDP | DISP/GD M+F | WORKFLOW B | HIGH WEIGHT | MID WEIGHT | HIGHER PRIORITY | |

FIG. 20A

| FRACTURE TYPE | M-F | MODEL | PROCESS | MACROSCALE | MLDE | FLDE | GD | |
|---|---|---|---|---|---|---|---|---|
| MFD (3) | MFD_F TREAT AS DUAL POROSITY | DPSP | GD/DISP M+F | WORKFLOW B | MID WEIGHT | MID WEIGHT | MID PRIORITY | HIGH EOR POTENTIAL |
| | | DPDP | GD/DISP M+F | WORKFLOW B | MID WEIGHT | MID WEIGHT | MID PRIORITY | |
| | MFD_M TREAT AS DUAL POROSITY | DPSP | DISP/GD M+F | WORKFLOW B | MID WEIGHT | MID WEIGHT | MID PRIORITY | HIGH EOR POTENTIAL |
| | | DPDP | DISP/GD M+F | WORKFLOW B | MID WEIGHT | MID WEIGHT | MID PRIORITY | |
| MD (4) | MD_F TREAT AS DUAL POROSITY | DPSP | DISP/GD M+F | WORKFLOW B | HIGH WEIGHT | LOW WEIGHT | HIGHER PRIORITY | HIGH EOR POTENTIAL - MATRIX DOMINATED |
| | | DPDP | DISP/GD M+F | WORKFLOW B | HIGH WEIGHT | LOW WEIGHT | MID PRIORITY | |
| | MD_M TREAT AS DUAL POROSITY | DPSP | GD/DISP M+F | WORKFLOW A | HIGH WEIGHT | LOW WEIGHT | HIGHER PRIORITY | HIGH EOR POTENTIAL - MATRIX DOMINATED |
| | | DPDP | GD/DISP M+F | WORKFLOW A | HIGH WEIGHT | LOW WEIGHT | MID PRIORITY | |

FIG. 20B

ANALYSIS OF ENHANCED OIL RECOVERY (EOR) PROCESSES FOR NATURALLY-FRACTURED RESERVOIRS

CROSS-REFERENCE TO RELATED APPLICATION

This application claims the benefit of U.S. Provisional Application No. 61/695,992 filed on Aug. 31, 2012 by Omer Gurpinar, et al., the entire disclosure of which is incorporated by reference herein.

BACKGROUND

In view of increasing oil prices and declining reserves, the demand for increased recovery and production of oil from oilfield reservoirs has been growing. Traditional oil production processes, often referred to as primary and secondary recovery, may only be capable of recovering 20-40% of the reserves in an oilfield reservoir. As such, a demand has arisen for more advanced processes capable of extracting additional reserves from existing oilfield reservoirs.

The term Enhanced Oil Recovery (EOR) is used in connection with a number of different recovery techniques capable of recovering additional reserves from oilfield reservoirs. In many instances, EOR techniques may be used to recover 25% or more of the remaining reserves in an oilfield reservoir. EOR techniques may include a wide variety of different technologies, such as some forms of waterflooding, gasflooding (e.g., using hydrocarbon gas, nitrogen and/or carbon dioxide), chemical flooding (e.g., using polymers, surfactants and/or alkalis) and thermal techniques (e.g., steam injection, hot water injection, electrical heating and/or combustion), among others.

However, selection of the optimal EOR technique, or combination of EOR techniques, for a particular oilfield reservoir is highly dependent upon the properties of the reservoir (e.g., temperature, pressure, salinity, oil composition, rock properties, etc.) as well as additional concerns such as economic factors (e.g., up front capital investment, current and/or projected oil prices, ongoing implementation costs, etc.) One technique that may provide superior results for one oilfield reservoir (generally represented by a metric such as Incremental Recovery Factor (IRF)) may be too costly, or may provide sub-optimal results, for another oilfield reservoir. However, the selection of a particular EOR process (hereinafter, either an EOR process or an EOR scheme), associated with a particular level of recovery from an oilfield reservoir, traditionally has been accomplished in a time consuming and disintegrated manner, and based upon substantial human knowledge and expertise.

More recently, software-based tools have been developed to automate and otherwise facilitate the selection of EOR processes and generate estimations of incremental recovery that may be expected from EOR processes for a given oilfield reservoir. One limitation of such software-based tools, however, has been that such tools are limited to single porosity systems and models, i.e., non-fractured reservoirs where the porosity of the reservoir may be adequately represented by the porosity associated with the rock matrix of the reservoir.

Existing software-based tools, however, are incapable of analyzing EOR processes for other types of oilfield reservoirs, and in particular multiple-porosity systems such as naturally-fractured reservoirs (NFR's) where the porosity of the reservoir is based upon not only the porosity of the rock matrix but also the porosity of fractures in the rock matrix.

It has been found, in particular, that flow and recovery systems as well as the rock heterogeneity are substantially more complex in NFR's than in non-fractured reservoirs, and as a result, existing software-based tools are generally incapable of generating sufficiently accurate estimations of incremental recovery.

Therefore, a substantial need continues to exist in the art for an improved manner of facilitating the selection of EOR processes and estimating incremental recovery from such processes for naturally-fractured reservoirs.

SUMMARY

A method, apparatus, and program product method generate an estimation of an incremental recovery for an Enhanced Oil Recovery (EOR) process performed on a naturally-fractured reservoir by classifying the naturally-fractured reservoir based upon a set of reservoir properties associated with the naturally-fractured reservoir, and generating an estimation of the incremental recovery for at least one EOR process based on the classification of the naturally-fractured reservoir.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

BRIEF DESCRIPTION OF THE DRAWINGS

FIG. 14 illustrates respective properties of four fracture type classifications.

FIGS. 20A-20B illustrate a summary of the analysis of FIGS. 9-19 along with the identification of EOR potential for each fracture type (FD, FMD, MFD and MD) based on matrix-fracture interaction, oil distribution and dominant NFR forces balance.

DETAILED DESCRIPTION

Figure 1:
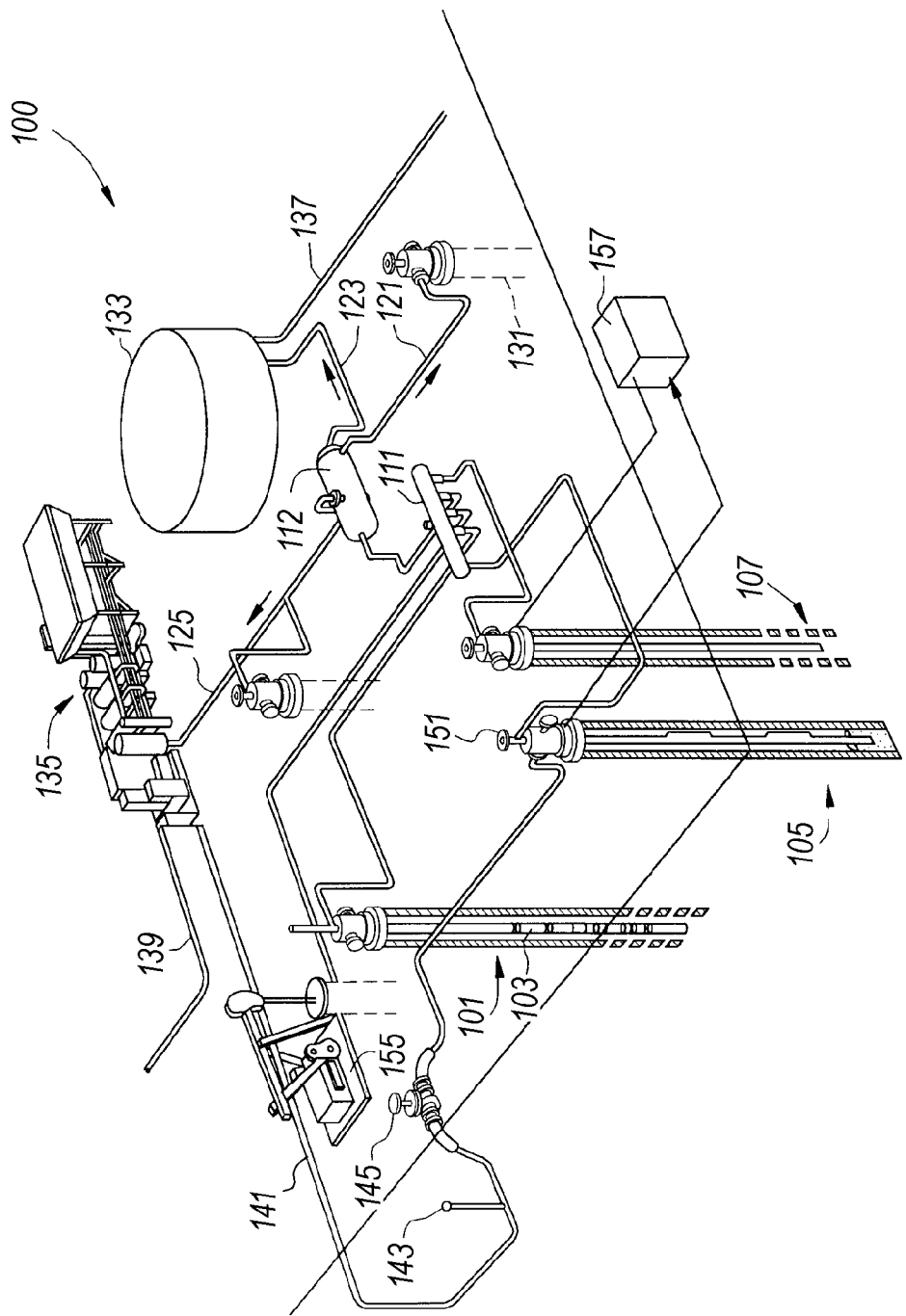
FIG. 1 illustrates a typical oilfield layout.

The herein-described embodiments provide a method, apparatus, and program product that provide automated analysis of Enhanced Oil Recovery (EOR) processes for Naturally-Fractured Reservoirs (NFR's). As will become more apparent below, the herein described embodiments may be used to generate an estimation of an incremental recovery for an EOR process performed on a naturally-fractured reservoir in part by classifying the naturally-fractured reservoir based upon a set of reservoir properties associated with the naturally-fractured reservoir, and generating an estimation of the incremental recovery for at least one EOR process based on the classification of the naturally-fractured reservoir.

An EOR process, scheme, or technique, in this regard, may include any number of different recovery techniques capable of recovering additional reserves from oilfield reservoirs, including, but not limited to waterflooding, gas-flooding (e.g., using hydrocarbon gas, nitrogen and/or carbon dioxide), chemical flooding (e.g., using polymers, surfactants and/or alkalis) and thermal techniques (e.g., steam injection, hot water injection, electrical heating and/or combustion). In addition, EOR processes may incorporate combinations of different techniques, applied in different orders, and utilizing different processing parameters.

A naturally-fractured reservoir (NFR) is a reservoir where hydrocarbon exists not only in the matrix but also in the fracture system; therefore such reservoirs are often referred as "dual-porosity" systems. Presence of matrix and fracture systems brings two different flow systems which also communicate with each other. Fluid flow in such reservoirs necessitates understanding of both media as well as the exchange therebetween. Various EOR schemes work differently in NFR reservoirs as opposed to the matrix-only (single porosity) systems. Progression of EOR schemes in each media (matrix and fracture) will be different and the exchange between the matrix and fracture generally causes the overall EOR process to be very challenging to plan, implement and manage.

The herein-described embodiments, for example, may be used to guide a user in order to locate and identify technically and economically applicable EOR schemes for naturally-fractured oilfield reservoirs in an integrated and efficient manner in order to estimate an incremental recovery that may be expected from a selected Enhanced Oil Recovery (EOR) process. In one embodiment, an integrated and smart tool may be used to guide users to identify and select a particular EOR scheme, and, as a result, provide an estimation of recovery gains based on the application of the selected EOR scheme to a given naturally-fractured reservoir. As will become more apparent below, the tool may incorporate in one embodiment an input component, a screening component, an estimator component and a smart guide component. The components may be integrated in such a way that, when a set of reservoir properties (either as a 3D reservoir model or average reservoir properties) for a naturally-fractured reservoir are available to the smart guide component, a subsequent reservoir engineering based decision system may be used to enable a user to identify EOR schemes or processes, and, when the EOR schemes or processes are identified, determine an estimate of an incremental recovery of oil from a naturally-fractured reservoir.

In one embodiment, the smart guide component includes a set of collective knowledge that is based on EOR knowledge, reservoir engineering knowledge, and reservoir modeling knowledge and expertise. As a result, in view of the current low experience and resource limited EOR industry, EOR projects that are implemented as a result of the qualitative and/or quantitative analysis provided thereby may lead to higher recovery performance from the naturally-fractured reservoir fields, as well as compensate for a shortage of resources by passing a manual engineering decision making process to the EOR systems in the EOR industry, and thereby providing a positive impact on the optimization of the non-renewable energy resources.

It has been found that the addition of NFR capability is not a routine enhancement to an EOR analysis tool, e.g., the tool described in U.S. P.G. Pub. No. 2010/0004865 to Gurpinar, the disclosure of which is incorporated by reference herein. The addition of NFR capability necessitates additional physics and reservoir engineering-based processes and workflows, as well as additional decision methodologies for a smart guide system in such a digital framework. Other variations and modifications will be apparent to one of ordinary skill in the art.

Oilfield Operations

Referring to FIG. 1, a typical oilfield layout is illustrated at 100. Workers assemble machinery and modify the underlying formations in order to extract hydrocarbons, such as oil and gas. An operations control center including a computer or data processing system 157 may assist in collecting data and making decisions to enhance operations in the oilfield. Data may include, for example, measurements of bottom-hole pressure and tubing head pressure. As shown in FIG. 1, the oil field operations include a number of wells. Specifically, the oil field operations include first producing well 101, which uses an electric submersible pump 103 to produce a hydrocarbon (e.g., oil, gas, etc.), a second well 105, which relies on a gas lift to produce a hydrocarbon; and a third well 107, which produces a hydrocarbon on the basis of natural flow. First producing well 101, second well 105, and third well 107 deliver production fluids (e.g., hydrocarbon produced from their respective wells) to a production manifold 111. The production manifold collects multiple streams and outputs the streams to a gas and oil separator 112. Upon receipt of the production fluids by the gas and oil separator 112, the gas and oil separator 112 separates produced water 121, produced oil 123, and produced gas 125, respectively to water disposal well 131, oil storage 133, and a compressor station 135.

In one embodiment, oil storage 133 may transfer oil via an oil export pipeline 137. Similarly, the compressor station 135 may use gas export pipeline 139 to transfer gas. Finally, the compressor station 135 may process gas as an injection gas 141. In order to adjust pressure on the injection gas, a meter and control system 143 may cooperate with an injection-gas manifold 145. The operation of the meter and control system 143 may regulate pressure of the injection gas as the injection gas is delivered to a wellhead tubing and casing 151. In addition to the injection gas, extracting efforts may rely upon a rod pump 155 to drive a downhole pump assembly via a reciprocating motion. In such cases, the rod pump 155 propels hydrocarbons to the production manifold 111.

The operations control center may receive data from sensors corresponding to the second well 105. The sensors may include, for example, a pressure sensor that measures fluid pressures at the wellhead. The operations control center may also operate and/or control equipment in the third well 107. The operations control center may use a data processing system 157 (shown in more detail in FIG. 2) including a communication unit, a processor, and a memory all of which are connected via a bus. The memory is configured to store one or more sets of instructions. Further, the processor unit (e.g., a microprocessor) is configured to execute one or more of the sets of instructions to control, for example, the operation of the third well 107. In addition, the processor unit may also calculate averages or otherwise combine expert interviewee inputs. Finally, the communication unit operates as an interface between the operations control center and the other oilfield operations components shown in FIG. 1. As such, the communications interface is configured to receive data from the oilfield operations components and to send commands and/or data to the oilfield operations components.

Hardware and Software Environment

Figure 2:
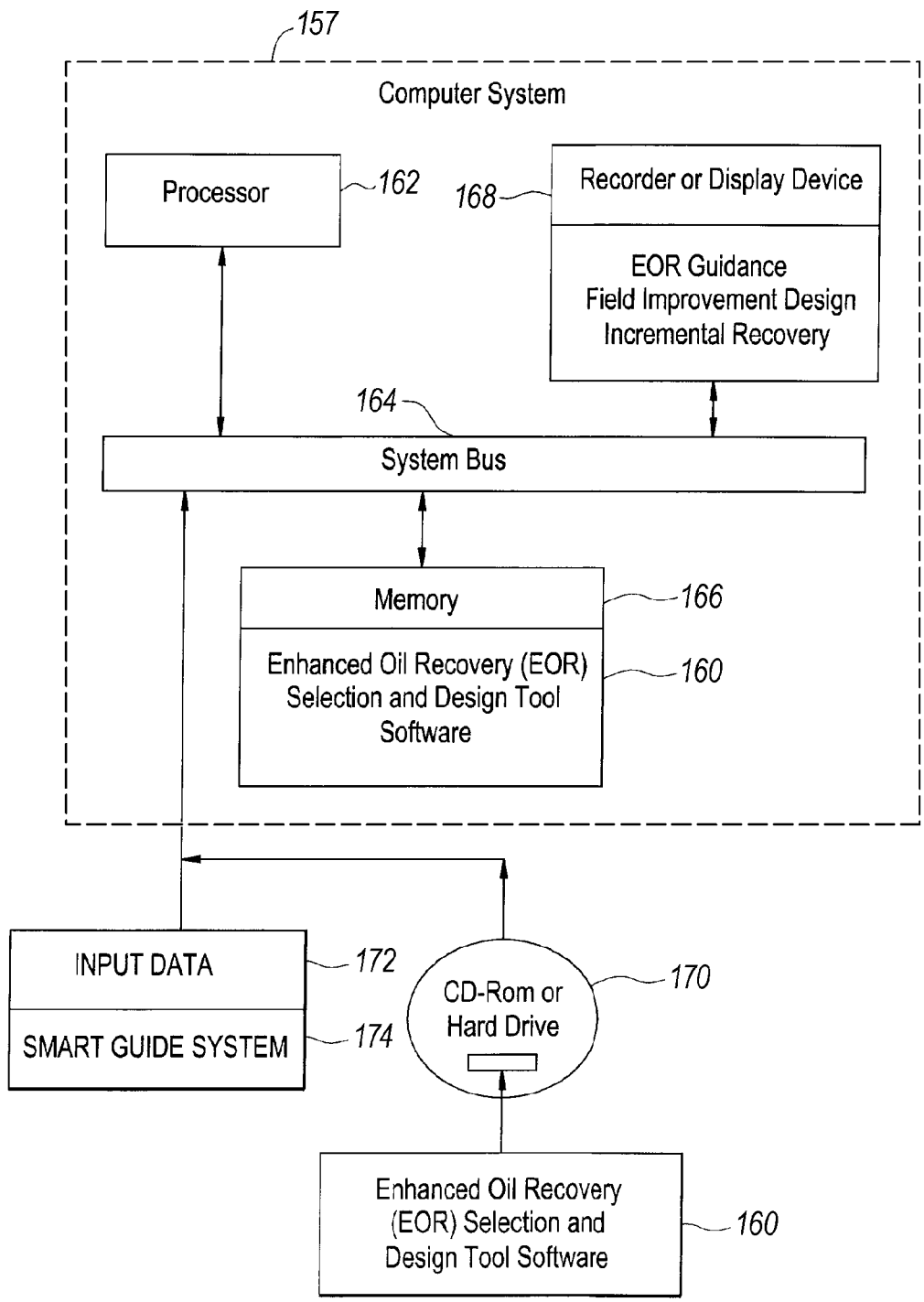
FIG. 2 illustrates an example implementation of a computer system suitable for use with the oilfield layout of FIG. 1 and within which may be implemented naturally-fractured reservoir EOR analysis consistent with the invention.

FIG. 2 illustrates an example computer system in which the various technologies and techniques described herein may be implemented. The system may include one or more computers 157, each including a central processing unit including at least one hardware-based processor 162 coupled via a system bus 164 to a memory 166, which may represent the random access memory (RAM) devices comprising the main storage of computer 157, as well as any supplemental levels of memory, e.g., cache memories, non-volatile or backup memories (e.g., programmable or flash memories), read-only memories, etc. In addition, memory 166 may be considered to include memory storage physically located elsewhere in computer 157, e.g., any cache memory in a processor, as well as any storage capacity used as a virtual memory, e.g., as stored on a mass storage device or on another computer coupled to computer 157.

Computer 157 also generally receives a number of inputs and outputs for communicating information externally. For interface with a user or operator, computer 157 generally includes a user interface incorporating one or more user input devices, e.g., recorder or display device 168, as well as a keyboard, a pointing device, a printer, etc. Otherwise, user input may be received, e.g., over a network interface coupled to a network, from one or more external client or server computers. Computer 157 also may be in communication with one or more mass storage devices, which may be, for example, internal hard disk storage devices, external hard disk storage devices, storage area network devices, etc.

Computer 157 generally operates under the control of an operating system and executes or otherwise relies upon various computer software applications, components, programs, objects, modules, data structures, etc. For example, an EOR analysis tool such as a EOR selection and design tool software 160, shown resident both in memory 166 and on a mass storage device or CD-Rom 170, may be executed by computer 157, receiving input data 172, which may include a smart guide system 174 (discussed in greater detail below in connection with FIGS. 3-4), and displaying to a user, e.g., on recorder or display device 168, various output data such as EOR guidance data, field improvement design data and incremental recovery data. Input data 172 may also include a set of reservoir properties, e.g., associated with a 3D reservoir model or average reservoir properties, as will be discussed in greater detail below.

In general, the routines executed to implement the embodiments disclosed herein, whether implemented as part of an operating system or a specific application, component, program, object, module or sequence of instructions, or even a subset thereof, will be referred to herein as "computer program code," or simply "program code." Program code generally comprises one or more instructions that are resident at various times in various memory and storage devices in a computer, and that, when read and executed by one or more processors in a computer, cause that computer to perform the operations embodying desired functionality. Moreover, while embodiments have and hereinafter will be described in the context of fully functioning computers and computer systems, those skilled in the art will appreciate that the various embodiments are capable of being distributed as a program product in a variety of forms, and that the invention applies equally regardless of the particular type of computer readable media used to actually carry out the distribution.

Such computer readable media may include computer readable storage media and communication media. Computer readable storage media is non-transitory in nature, and may include volatile and non-volatile, and removable and non-removable media implemented in any method or technology for storage of information, such as computer-readable instructions, data structures, program modules or other data. Computer readable storage media may further include RAM, ROM, erasable programmable read-only memory (EPROM), electrically erasable programmable read-only memory (EEPROM), flash memory or other solid state memory technology, CD-ROM, DVD, or other optical storage, magnetic cassettes, magnetic tape, magnetic disk storage or other magnetic storage devices, or any other medium that can be used to store the desired information and which can be accessed by computer 10. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

Various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the example environment illustrated in FIG. 2 is not intended to limit the invention. Indeed, those skilled in the art will recognize that other alternative hardware and/or software environments may be used without departing from the scope of the invention.

Figure 3:
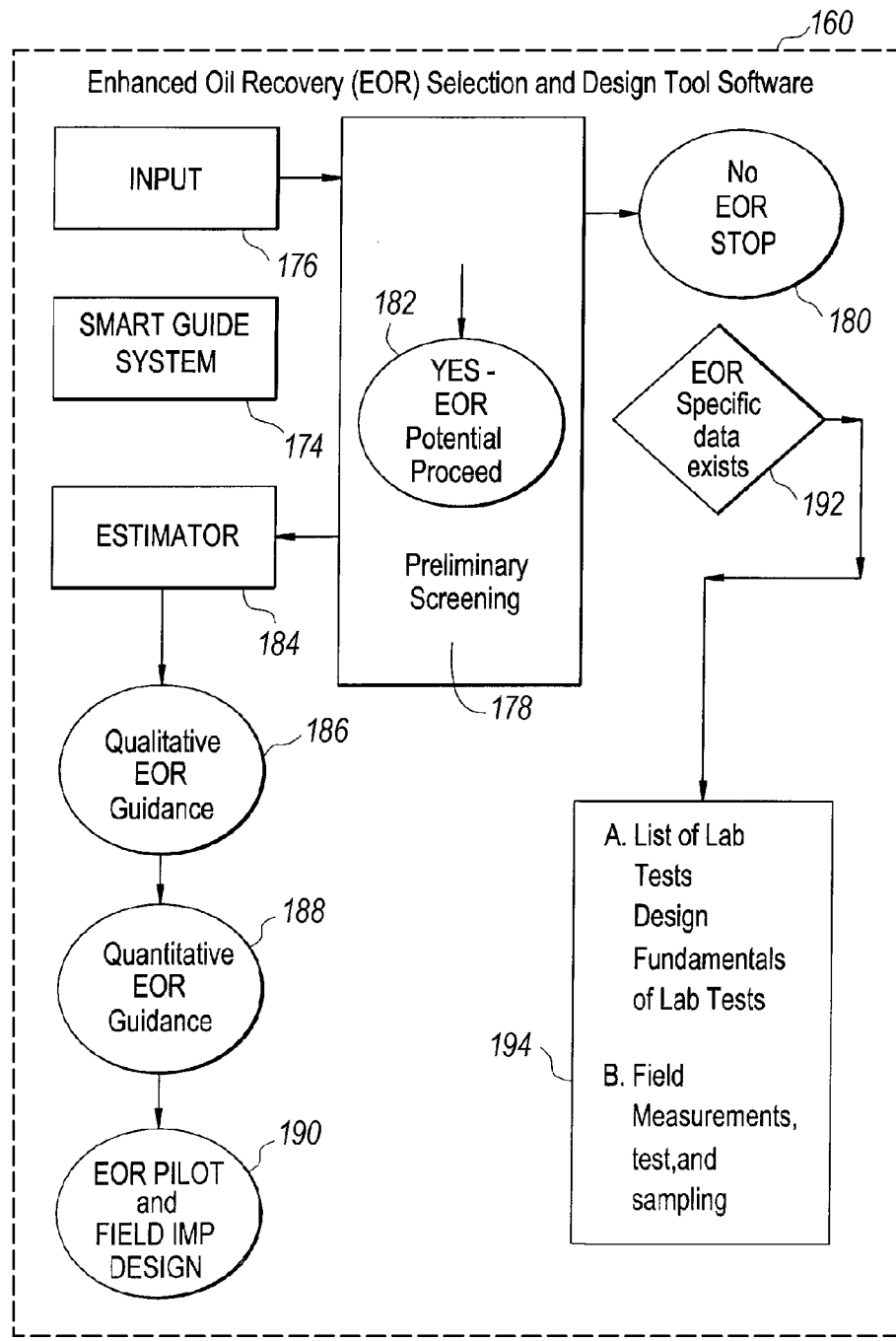
FIG. 3 illustrates an example implementation of the EOR analysis tool referenced in FIG. 2.

Analysis Of Enhanced Oil Recovery (EOR) Processes For Naturally-Fractured Reservoirs Referring to FIG. 3, an example implementation of EOR analysis tool 160 is illustrated in greater detail. An input component 176 includes and generates a set of reservoir properties, such as either reservoir properties obtained from a 3D reservoir model or average reservoir properties. The set of reservoir properties, generated from the input component 176, are received by a preliminary screening component 178. In the preliminary screening component 178, in response to the set of reservoir properties received from the input component 176, the processor 162 of the computer system 157 of FIG. 2 consults the smart guide system 174 in an attempt to match the received set of reservoir properties with the information stored in the smart guide system 174.

In response thereto, the processor 162 determines that either: (1) EOR potential exists, or (2) no EOR potential exists for the aforementioned set of reservoir properties. If no EOR potential exists, control passes to a no EOR stop block 180, and the processor 162 stops executing EOR analysis tool 160. However, if EOR potential exists, control passes to the YES—EOR potential proceed block 182. At this point, it has been determined that certain EOR specific data exists (block 192). The EOR specific data may include, for example, the data illustrated in block 194: (1) a list of lab tests, and/or design fundamentals of the lab tests, and/or (2) field measurements and/or field tests and sampling. When the processor 162 encounters the YES—EOR potential proceed block 182, an estimator component 184 then generates an incremental recovery estimation representing what may be expected from a selected EOR process for the given reservoir, which may be recorded or displayed on the output display of the recorder or display device 168 of FIG. 2. When the estimator component 184 generates the incremental recovery estimate, the estimator component 184 may also generate: (1) qualitative EOR guidance 186, (2) quantitative EOR guidance 188, and (3) an EOR pilot and field improvement design 190 (each of which may also be displayed on the output display of the recorder or display device 168) that is adapted for generating an increased or an additional/incremental amount of reserves from an oilfield reservoir.

In order to enhance the aforementioned functionality of the smart guide system 174, input component 176, preliminary screening component 178 and estimator component 184 for use with naturally-fractured reservoirs, the reservoir model is first processed to establish the distribution of its NFR characteristics. This process leads to a new reservoir model with a new property that may be referred to as "NFR classification distribution". NFR classification along with the matrix and fracture properties from the original model establishes representative reservoir units that are utilized to estimate typical EOR behavior for different EOR schemes. The smart guide system described herein may be used to lead the user through the various steps of the NFR classification to estimate the EOR performance for representative units.

Figure 4:
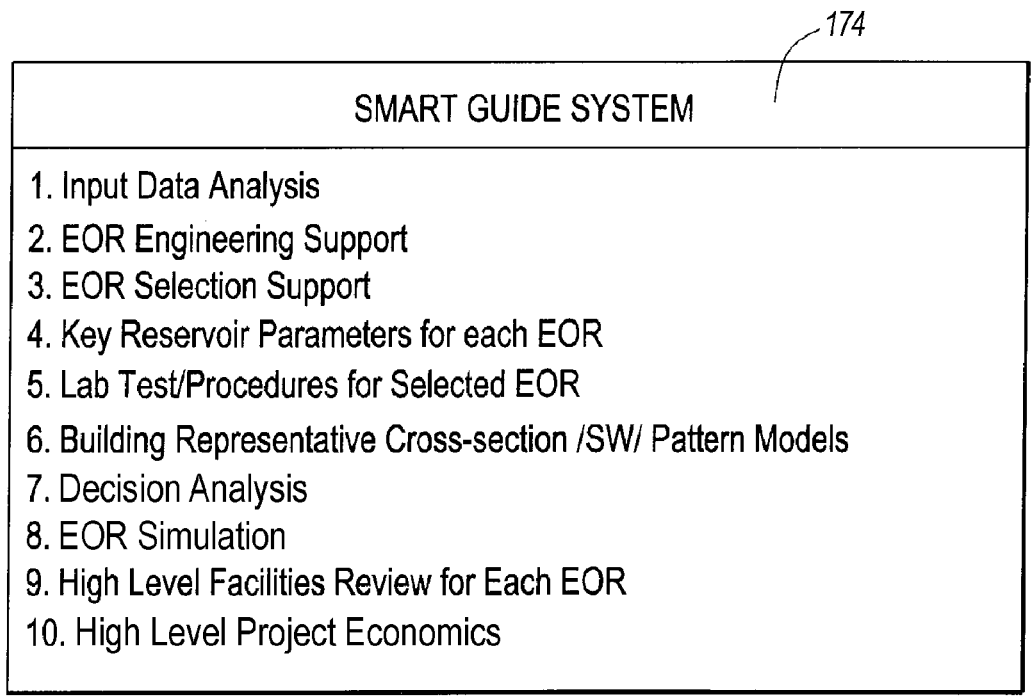
FIG. 4 illustrates an example implementation of the smart guide system referenced in FIG. 3.

Referring to FIG. 4, smart guide system 174 is illustrated in greater detail. Recall that processor 162 consults the smart guide system 174 in an attempt to match the set of reservoir properties received from the input component 176 with the information stored in the smart guide system 174. In response thereto, the processor 162 determines that either: (1) EOR potential exists, or (2) no EOR potential exists for the aforementioned set of reservoir properties. In FIG. 4, the information stored in the smart guide system 174 may include the following information: (1) input data analysis, (2) EOR engineering support, (3) EOR process selection support, (4) reservoir parameters for each EOR process, (5) lab test/procedures for selected EOR processes, (6) representative cross section/SW/pattern models, (7) decision analysis, (8) EOR process simulation, (9) high level facilities review for each EOR process, and (10) high level project economics. As a result, the processor 162 consults the smart guide system 174 (and, in particular, the items illustrated in FIG. 4) in an attempt to match the set of reservoir properties received from the input component 176 with the information stored in the smart guide system 174 in order to determine if: (1) EOR potential exists, or (2) no EOR potential exists for the aforementioned set of reservoir properties.

Figure 5:
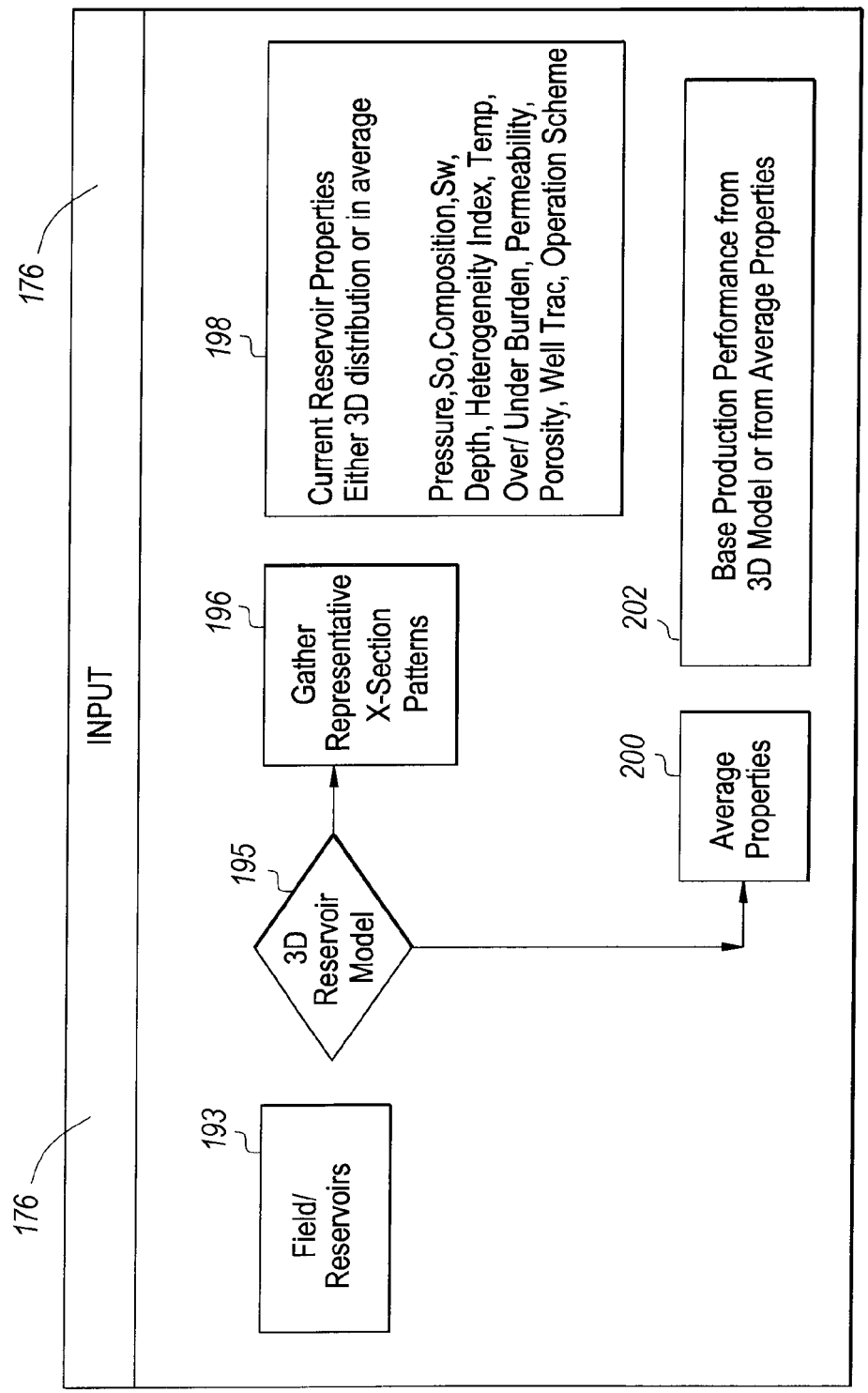
FIG. 5 illustrates an example implementation of the input operation referenced in FIG. 3.

Referring to FIG. 5, a detailed construction of the input component 176 of FIG. 3 is illustrated. Recall that the input component 176 generates a set of reservoir properties, such as either a 3D reservoir model or average reservoir properties that are input to the preliminary screening component 178. In FIG. 5, a reservoir field 193 is modeled or simulated, e.g., in a reservoir simulator, thereby generating a 3D reservoir model 195. In connection with the 3D reservoir model 195, refer to the gather representative cross-section patterns block 196. In connection with the representative cross-section patterns block 196, refer to block 198 wherein the representative cross-section patterns of block 196 provide current reservoir properties which are characterized by either a 3D distribution or an average, including, but not limited to, the following: pressure, So, composition, Sw, depth, heterogeneity Index, temperature, over/under burden, permeability, porosity, well trac, and operation scheme. In addition, in connection with the 3D reservoir model 195, refer to the average properties block 200. In connection with the average properties block 200, refer to block 202 wherein the average properties may be generated in response to a base production performance from the 3D model 195 or from average properties. Therefore, the input component 176 of FIG. 5 generates a set of reservoir properties, such as either a 3D reservoir model or average reservoir properties that are input to the preliminary screening component 178.

Figure 6:
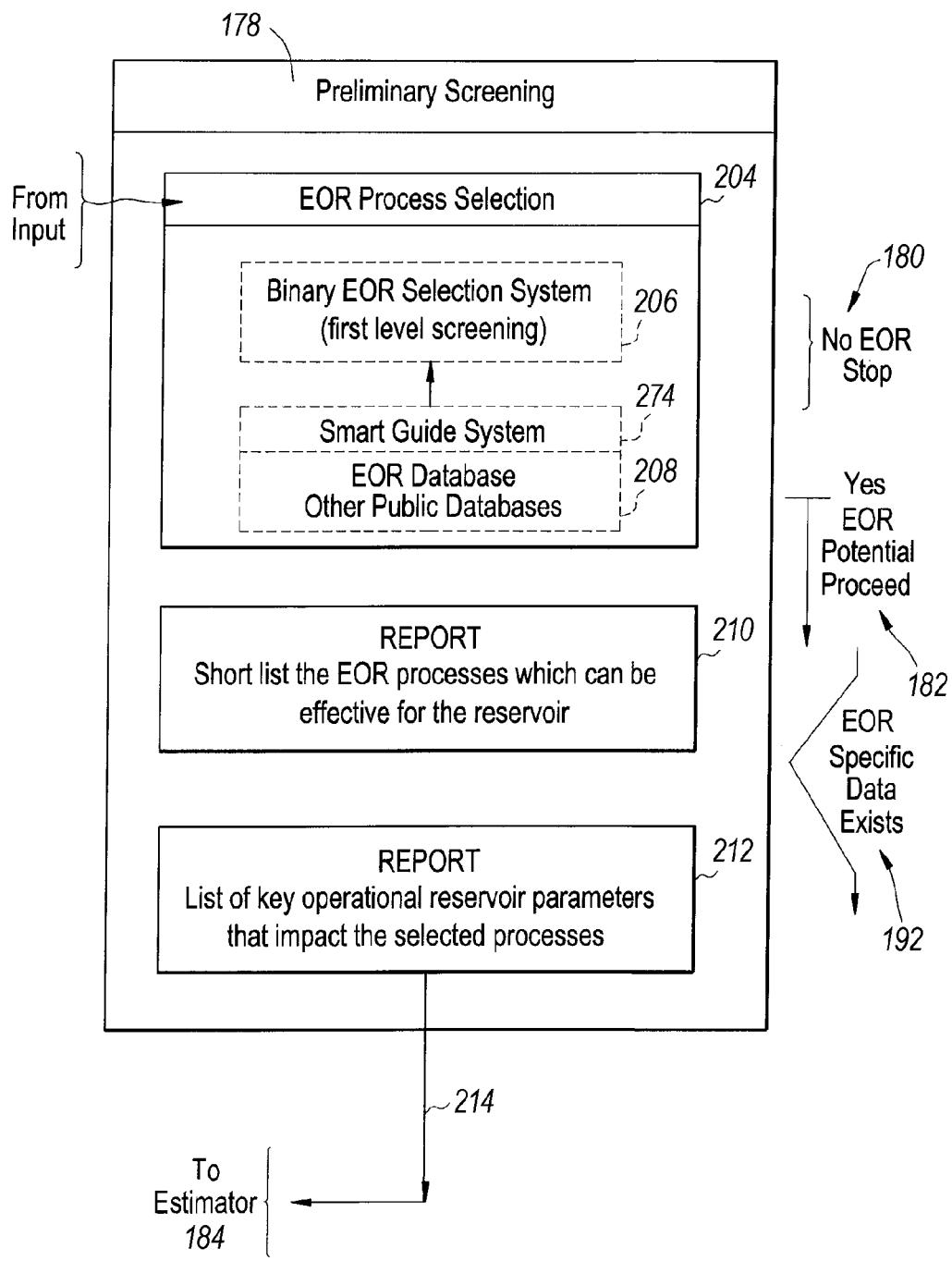
FIG. 6 illustrates an example implementation of the preliminary screening operation referenced in FIG. 3.

Referring to FIG. 6, a detailed construction of the preliminary screening component 178 of FIG. 3 is illustrated. Recall from FIG. 3 that, in the preliminary screening component 178, in response to the set of reservoir properties received from the input component 176, the processor 162 consults the smart guide system 174 in an attempt to match the received set of reservoir properties with the information stored in the smart guide system 174. In response thereto, the processor 162 determines that either: (1) EOR potential exists, or (2) no EOR potential exists for the aforementioned set of reservoir properties. If no EOR potential exists, control passes to the no EOR Stop block 180, and the processor 162 stops executing the software 160. However, if EOR potential exists, control passes to the YES—EOR potential proceed block 182. When the processor 162 encounters the YES—EOR potential proceed block 182, certain EOR specific data exists, block 192. The EOR specific data may include, for example, the data illustrated in block 194 of FIG. 3: (1) a list of lab tests, and/or design fundamentals of the lab tests, and/or (2) field measurements and/or field tests and sampling. In FIG. 6, in response to the set of reservoir properties, such as either a 3D reservoir model or average reservoir properties, from the input component 176, in an EOR process selection block 204, a binary EOR selection system 206 receives the set of reservoir properties from the input component 176 and, responsive thereto, the EOR selection system 206 consults the smart guide system 174 to determine if EOR potential exists in connection with the received set of reservoir properties.

Recall, in FIG. 4, that the smart guide system 174 contains a multitude of information that is used, by the EOR selection system 206, to determine if EOR potential exists in connection with the received set of reservoir properties. If, after consulting the smart guide system 174, the EOR selection system 206 determines that EOR potential does, in fact, exist in connection with the set of reservoir properties received from the input component 176, the EOR selection system 206 consults an EOR database or other public databases 208 in FIG. 6. The EOR database or other public databases 208 stores a plurality of reservoir properties and a plurality of EOR processes (or a plurality of EOR schemes) which correspond, respectively, with the plurality of reservoir properties.

The EOR selection system 206 then attempts to match, or substantially match, the set of reservoir properties received from the input component 176 with one or more of the reservoir properties stored in the EOR database or other public databases 208. Recalling that the EOR database or other public databases 208 stores reservoir properties and an EOR process or an EOR scheme that corresponds to the reservoir properties, when the EOR selection system 206 locates a match, or a substantial match, between the set of reservoir properties received from the input component 176 with the reservoir properties stored in the EOR database or other public databases 208, the EOR selection system 206 may generate or select the EOR process or EOR scheme that corresponds to the reservoir properties. In the preliminary screening component 178, a report 210 is generated that provides a list of the EOR process or processes that may be effective for the reservoir field 192. In addition, in the preliminary screening component 178, another report 212 may be generated that provides a list of operational reservoir parameters that impact the selected EOR processes. The EOR process or EOR scheme that corresponds to the one of the plurality of reservoir properties, the EOR process or EOR scheme may then be transmitted, via arrow 214, to the estimator component 184.

Figure 7:
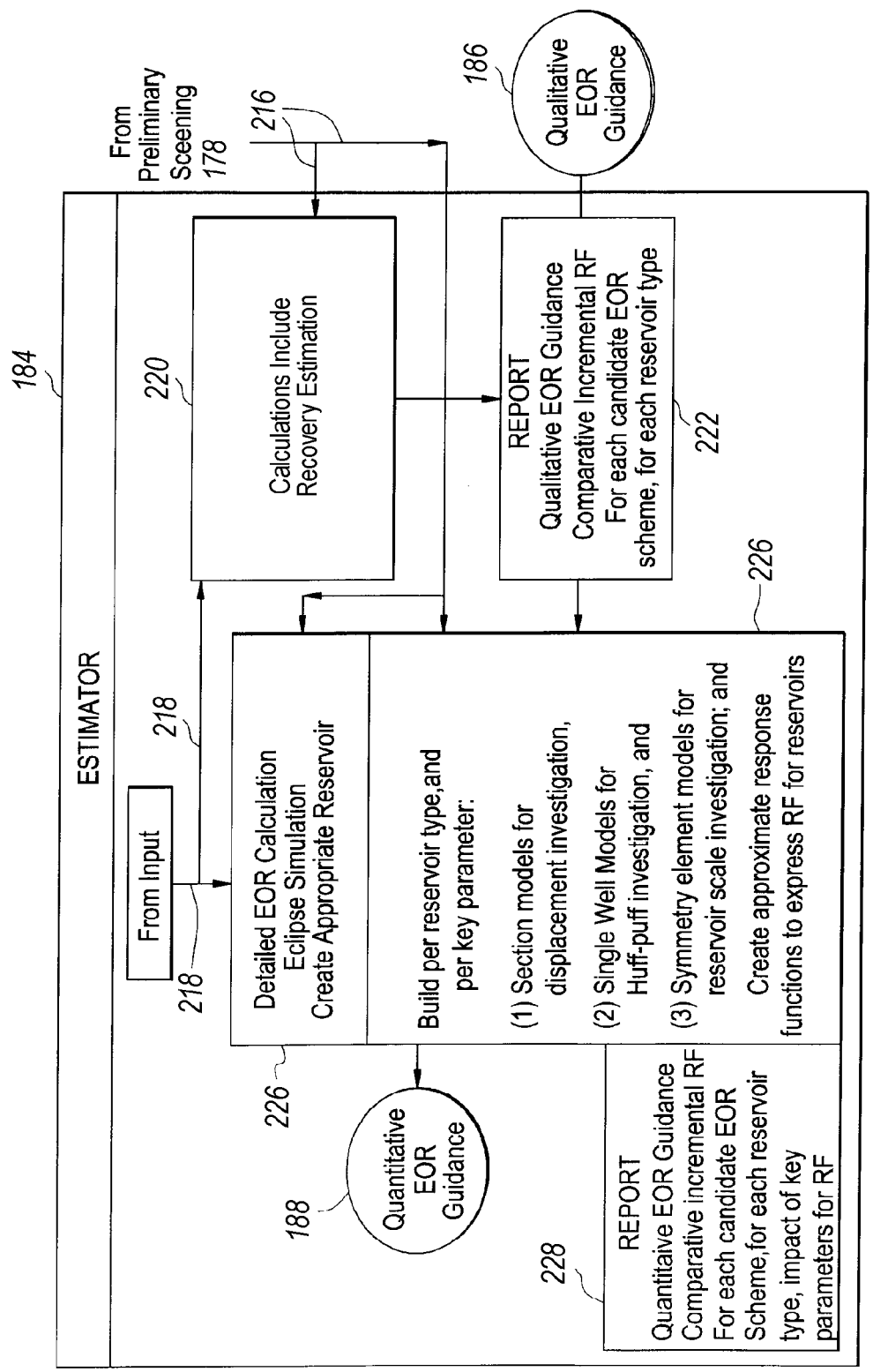
FIG. 7 illustrates an example implementation of the estimator operation referenced in FIG. 3.

Now referring to FIG. 7, a detailed construction of the estimator component 184 of FIG. 3 is illustrated. In the estimator component 184, a first set of calculations are performed via block 220, the first set of calculations 220 receiving: (1) the EOR process from the preliminary screening component 178 via arrow 216, and (2) the set of reservoir properties from the input component 176 via arrow 218. The first set of calculations 220 utilize the EOR process (from the preliminary screening component 178) and the set of reservoir properties (from the input component 176) to calculate an incremental recovery estimation that will estimate approximate incremental recovery per reservoir type. In response to the completion of the performance of the first set of calculations 220, a report 222 is then generated that provides: (1) qualitative EOR guidance, and (2) a comparative incremental recovery factor (RF) for each candidate EOR scheme (or EOR process) for each reservoir type. In view of the generation of the report 222, qualitative EOR guidance 186 is provided and generated for a user.

In addition, in the estimator component 184, a second set of calculations 226 may be performed via block 226, the second set of calculations 226 receiving: (1) the EOR process from the preliminary screening component 178 via arrow 216, and (2) the set of reservoir properties from the input component 176 via arrow 218. The second set of calculations 226 utilize the EOR process (from the preliminary screening component 178) and the set of reservoir properties (from the input component 176) to generate a detailed EOR calculation in connection with an Eclipse simulation in order to create an appropriate reservoir. In block 226, in order to create an appropriate reservoir, it may be desirable to build per reservoir type, and per parameter: (1) section models for displacement investigation, (2) single well models for Huff-Puff investigation, and (3) symmetry element models for a reservoir scale investigation; and to create approximate response functions to express an incremental recovery factor (RF) for the reservoirs. In response to the completion of the performance of the second set of calculations 226, a report 228 may be generated that provides: (1) quantitative EOR guidance, (2) a comparative incremental recovery factor (RF) for each candidate EOR scheme and for each reservoir type, and (3) the impact of parameters for each RF; that is, a list of the operational reservoir parameters that impact the selected EOR processes. In view of the generation of the report 228, quantitative EOR guidance 188 may be provided and generated for a user.

Figure 8:
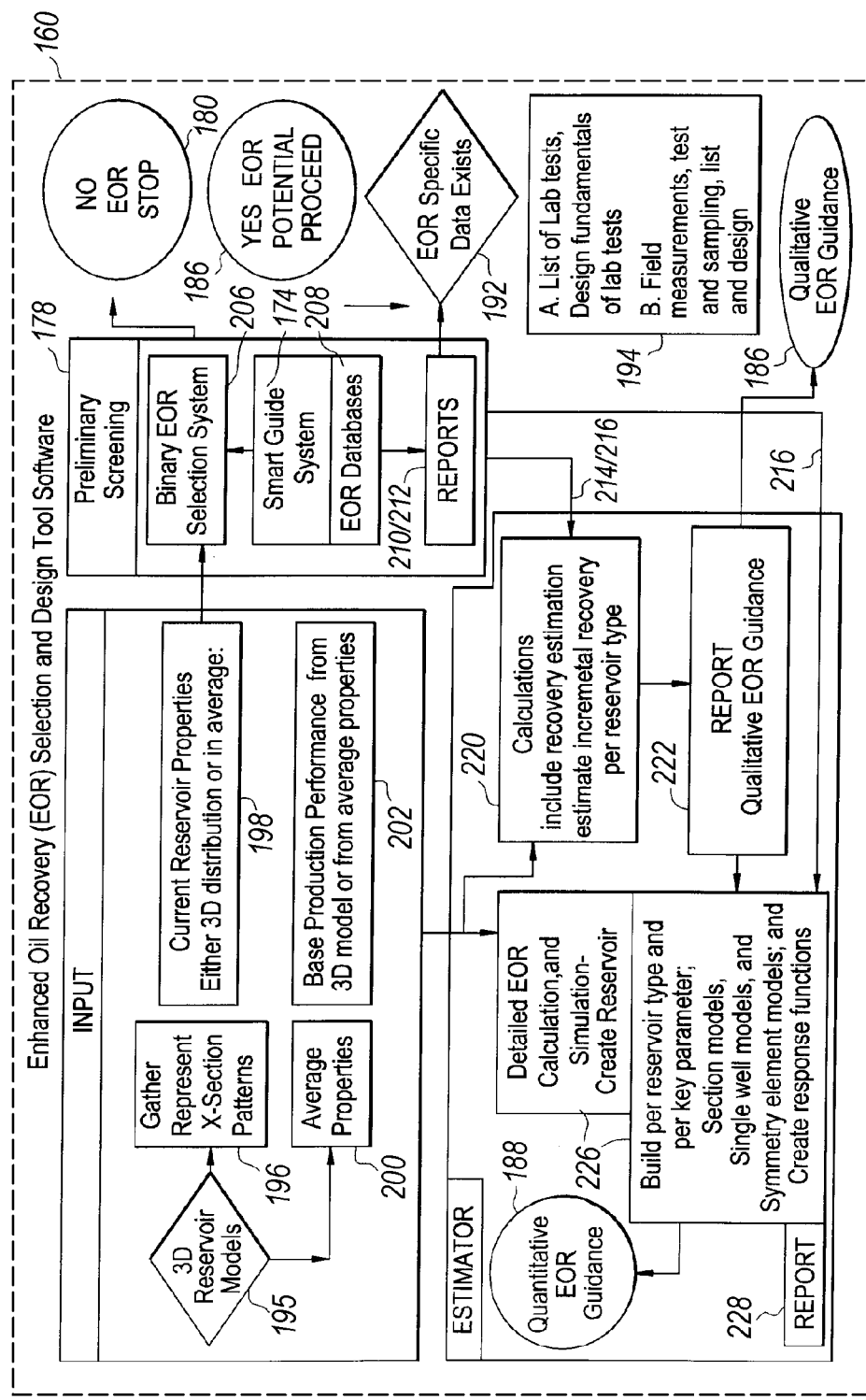
FIG. 8 illustrates another example implementation of the EOR analysis tool referenced in FIG. 2.

Referring now to FIG. 8, another example functional description of the operation of the EOR analysis tool 160, when executed by the processor 162, is set forth. In FIG. 8, the input component 176 receives a 3D reservoir model 195 and, responsive thereto, the input component 176 generates representative cross section patterns 196 and average properties 200, which is hereinafter referred to as a set of reservoir properties.

In the preliminary screening component 178, in response to the set of reservoir properties received from the input component 176 (such as either a 3D reservoir model or average reservoir properties), a binary EOR selection system 206 receives the set of reservoir properties from the input component 176 and, responsive thereto, the EOR selection system 206 consults the smart guide system 174 to determine if EOR potential exists in connection with the received set of reservoir properties. Recall, from FIG. 4, that the smart guide system 174 includes a multitude of information that is used, by the EOR selection system 206, to determine if EOR potential exists in connection with the received set of reservoir properties. If, after consulting the smart guide system 174, the EOR selection system 206 determines that EOR potential does, in fact, exist in connection with the set of reservoir properties received from the input component 176, the EOR selection system 206 consults an EOR database or other public databases 208.

The EOR database or other public databases 208 stores a plurality of reservoir properties and a plurality of EOR processes (or a plurality of EOR schemes) which correspond, respectively, with the plurality of reservoir properties. The EOR selection system 206 attempts to match, or substantially match, the set of reservoir properties which are received from the input component 176 with a one or more of the plurality of reservoir properties stored in the EOR database or other public databases 208. Recalling that the EOR database or other public databases 208 stores various reservoir properties and an EOR process or an EOR scheme that corresponds to the various reservoir properties, when the EOR selection system 206 locates a match, or a substantial match, between the set of reservoir properties that are received from the input component 176 with the reservoir properties stored in the EOR database or other public databases 208, the EOR selection system 206 generates or selects the EOR process or EOR scheme that corresponds to the reservoir properties.

In the preliminary screening component 178, a report 210 is generated to provide a list of the EOR processes that can be effective for the reservoir field 192. In addition, in the preliminary screening component 178, another report 212 may be generated that will provide a list of operational reservoir parameters that impact the selected EOR processes. Recalling that the EOR selection system 206 generates, via arrow 214, the EOR process or EOR scheme that corresponds to the reservoir properties, the EOR process or EOR scheme is transmitted, via arrow 214, to the estimator component 184.

In FIG. 8, the EOR process or EOR scheme from the preliminary screening component 178 is received by the estimator component 184. In addition, the set of reservoir properties from the input component 176 are received by the estimator component 184. In the estimator component 184 of FIG. 8, a first set of calculations 220 are performed, the first set of calculations 220 receiving: (1) the EOR process from the preliminary screening component 178, and (2) the set of reservoir properties from the input component 176. In FIG. 8, the first set of calculations 220 will utilize the EOR process (from the preliminary screening component 178) and the set of reservoir properties (from the input component 176) to calculate a recovery estimation that will estimate approximate incremental recovery per reservoir type, block 220 in FIG. 8. In FIG. 8, in response to the completion of the performance of the first set of calculations 220, a Report 222 is generated that will provide: (1) Qualitative EOR Guidance, and (2) a comparative incremental recovery factor (RF) for each candidate EOR scheme (or EOR process for each reservoir type. In view of the generation of the Report 222, Qualitative EOR Guidance 186 is provided and generated for a user.

In the estimator component 184 of FIG. 8, a second set of calculations 226 are performed via block 226, the second set of calculations 226 receiving: (1) the EOR process from the preliminary screening component 178, and (2) the set of reservoir properties from the input component 176. The second set of calculations 226 utilize the EOR process (from the preliminary screening component 178) and the set of reservoir properties (from the input component 176) to generate a detailed EOR calculation in connection with an Eclipse simulation in order to create an appropriate reservoir. In order to create an appropriate reservoir, it may be desirable to build per reservoir type, and per parameter: (1) section models for displacement investigation, (2) single well models for Huff-Puff investigation, and (3) symmetry element models for a reservoir scale investigation; and to create approximate response functions to express an incremental recovery factor (RF) for the reservoirs.

In response to the completion of the performance of the second set of calculations 226, a report 228 may be generated that provides: (1) quantitative EOR guidance, (2) a comparative incremental recovery factor (RF) for each candidate EOR scheme and for each reservoir type, and (3) the impact of parameters for each RF; that is, a list of the operational reservoir parameters that impact the selected EOR processes. In view of the generation of the report 228, quantitative EOR guidance 188 may be provided and generated for a user.

Figure 9:
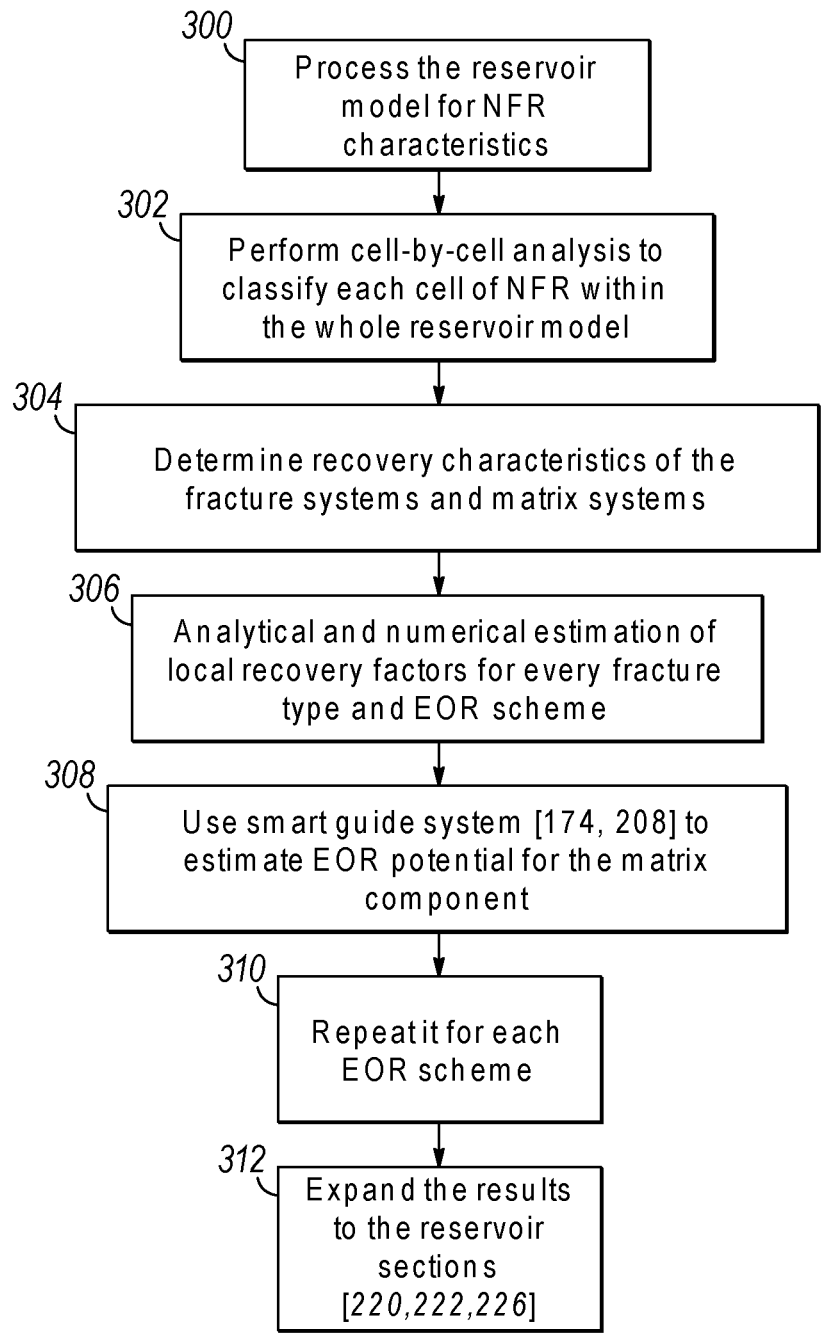
FIG. 9 illustrates a flowchart of an example EOR analysis methodology for a naturally-fractured reservoir for the EOR analysis tool referenced in FIG. 2.

With reference now to FIG. 9, an overview of an NFR-based EOR analysis methodology is further illustrated. In this methodology, the reservoir model for a naturally-fractured reservoir is initially processed to determine NFR characteristics for the model (block 300). Then, in block 302, cell-by-cell analysis is performed to classify each cell of the reservoir within the whole reservoir model. Then, in block 304, recovery characteristics of the fracture and matrix systems are calculated. Thereafter, in block 306 recovery factors are estimated for each classification, in block 308, the previously defined smart guide system is used to estimate EOR potential for the matrix component, and in block 310, this process is repeated for each EOR scheme. Then, in block 312 the results are expanded to the reservoir sections.

Figure 10:
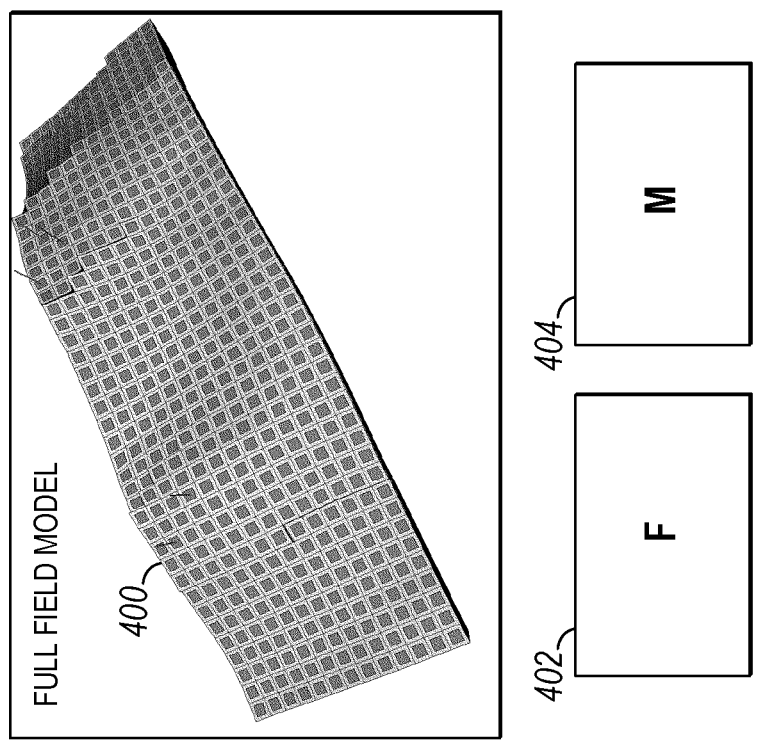
FIGS. 10-13 illustrate additional details regarding classification of a naturally-fractured reservoir using the EOR analysis methodology of FIG. 9.
Figure 11:
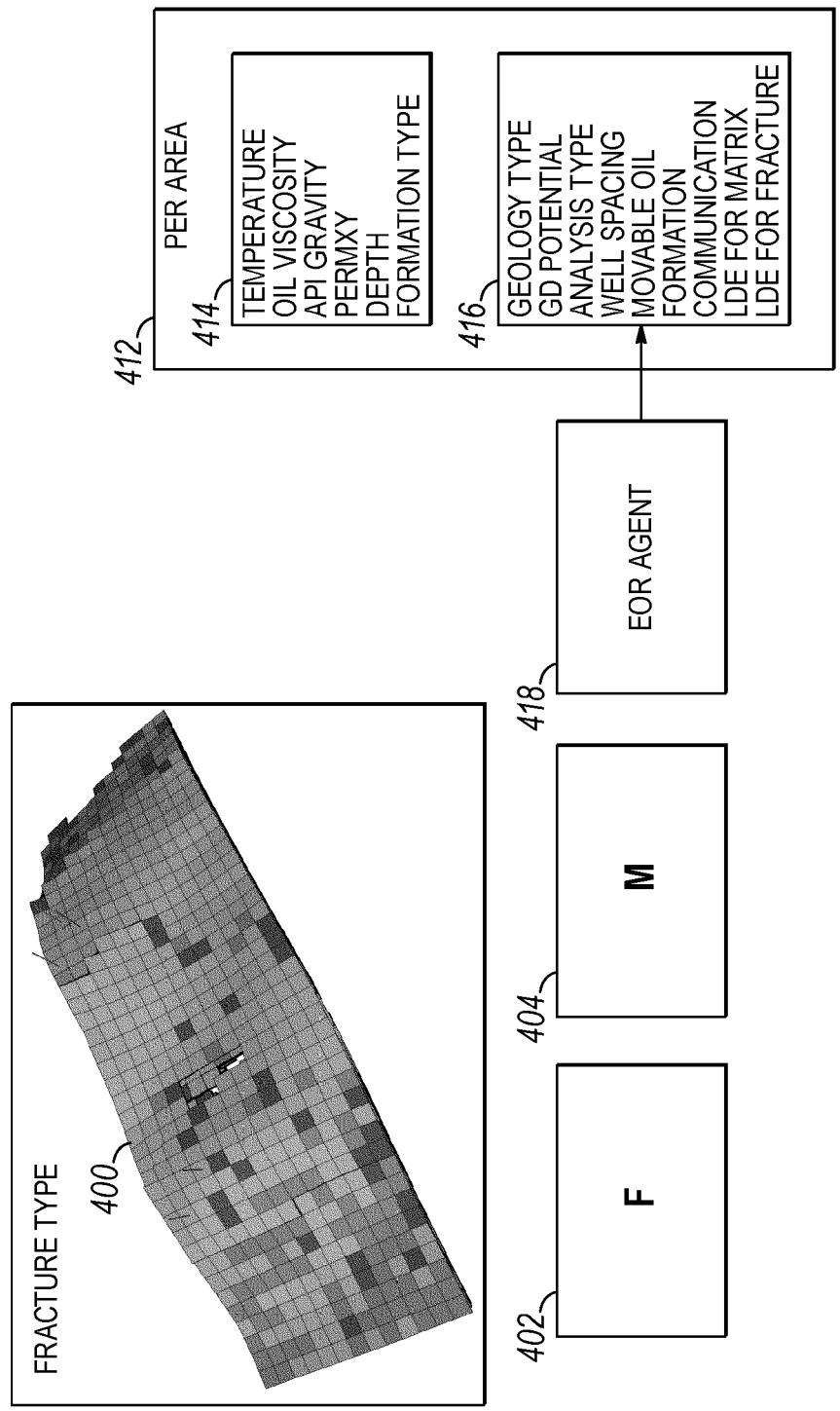

Further details regarding the methodology utilized to classify and analyze naturally-fractured reservoir are illustrated in FIGS. 10-13. FIG. 10, in particular illustrates the cell-by-cell analysis of a full field model 400, e.g., as discussed above in connection with block 302 of FIG. 9. Cell-by-cell analysis generates for each cell a fracture type based upon both the fracture system 402 and matrix system 404. Fractures may be classified, for example, into one of four types, designated herein as FD (fracture dominated), FMD (fracture matrix dominated), MFD (matrix fracture dominated) and MD (matrix dominated). FIG. 14 illustrates the matrix- and fracture-related properties used to assign fracture types, and it can be seen that the FD fracture type is characterized by, from the perspective of the matrix system, low storativity, low conductivity, and limited EOR potential, and from the perspective of the fracture system, high storativity, high conductivity, and EOR limited to fractures only. The FMD fracture type is characterized by, from the perspective of the matrix system, mid storativity, low conductivity, and moderate EOR potential, and from the perspective of the fracture system, mid storativity, high conductivity, and moderate EOR potential, subject to matrix-fracture interaction. The MFD fracture type is characterized by, from the perspective of the matrix system, high storativity, mid conductivity, and high EOR potential, and from the perspective of the fracture system, low storativity, mid conductivity, and high EOR potential. The MD fracture type is characterized by, from the perspective of the matrix system, high storativity, high conductivity, and high EOR potential, and from the perspective of the fracture system, low storativity, low conductivity, and high EOR potential, with matrix dominated.

Returning to FIG. 11, this figure illustrates the determination of recovery characteristics (block 304 of FIG. 9) to classify area types for the model 400. As illustrated at block 412, for each area, a number of properties 414 (temperature, oil viscosity, API gravity, permxy, depth and formation type) are collected from the reservoir model, while a number of additional properties 416 (e.g., geology type, gravity displacement (GD) potential, analysis type, well spacing, movable oil, formation, communication, and local displacement efficiency (LDE) for matrix and fracture) are collected based in part on EOR agent properties 418.

Figure 12:
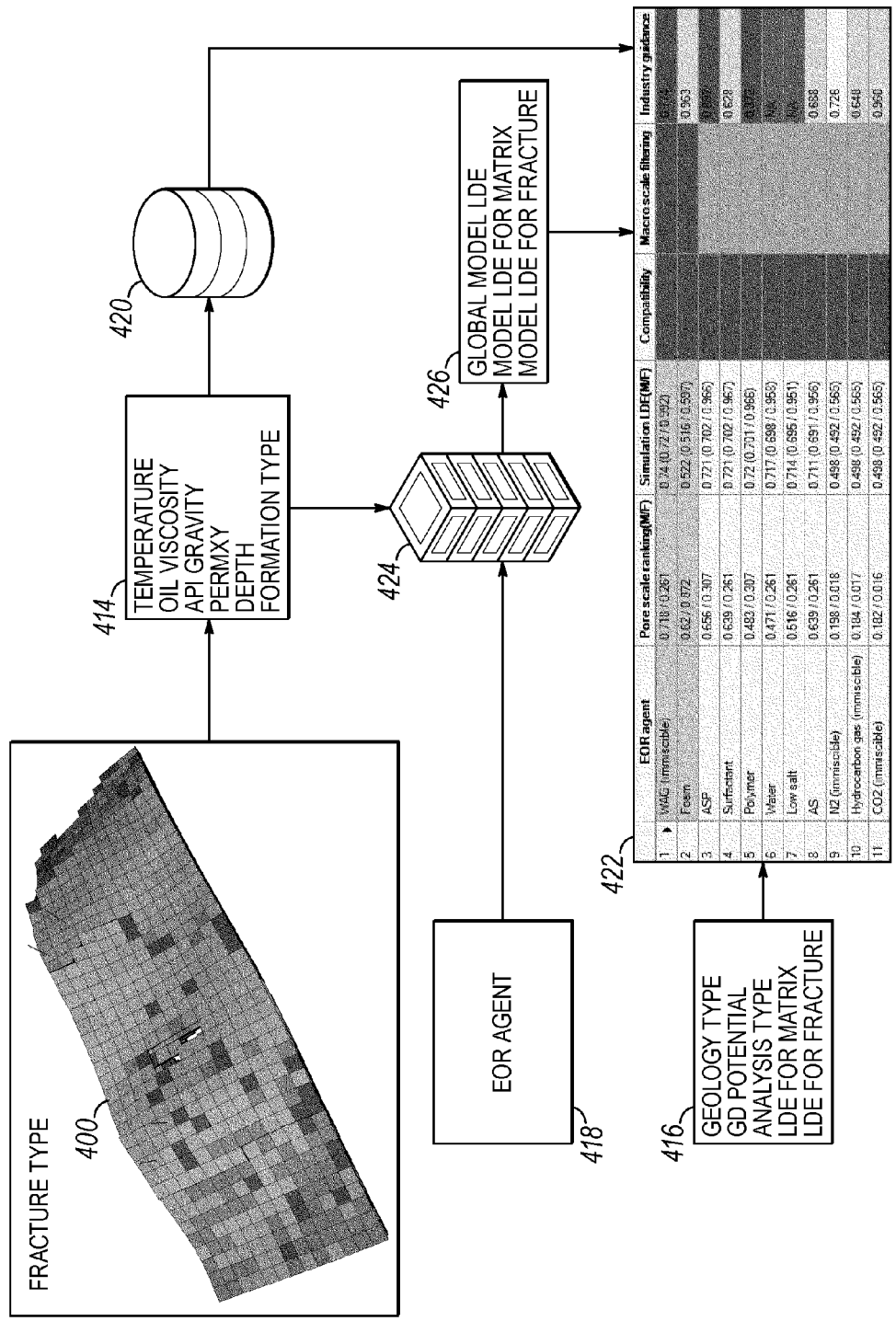
Figure 13:
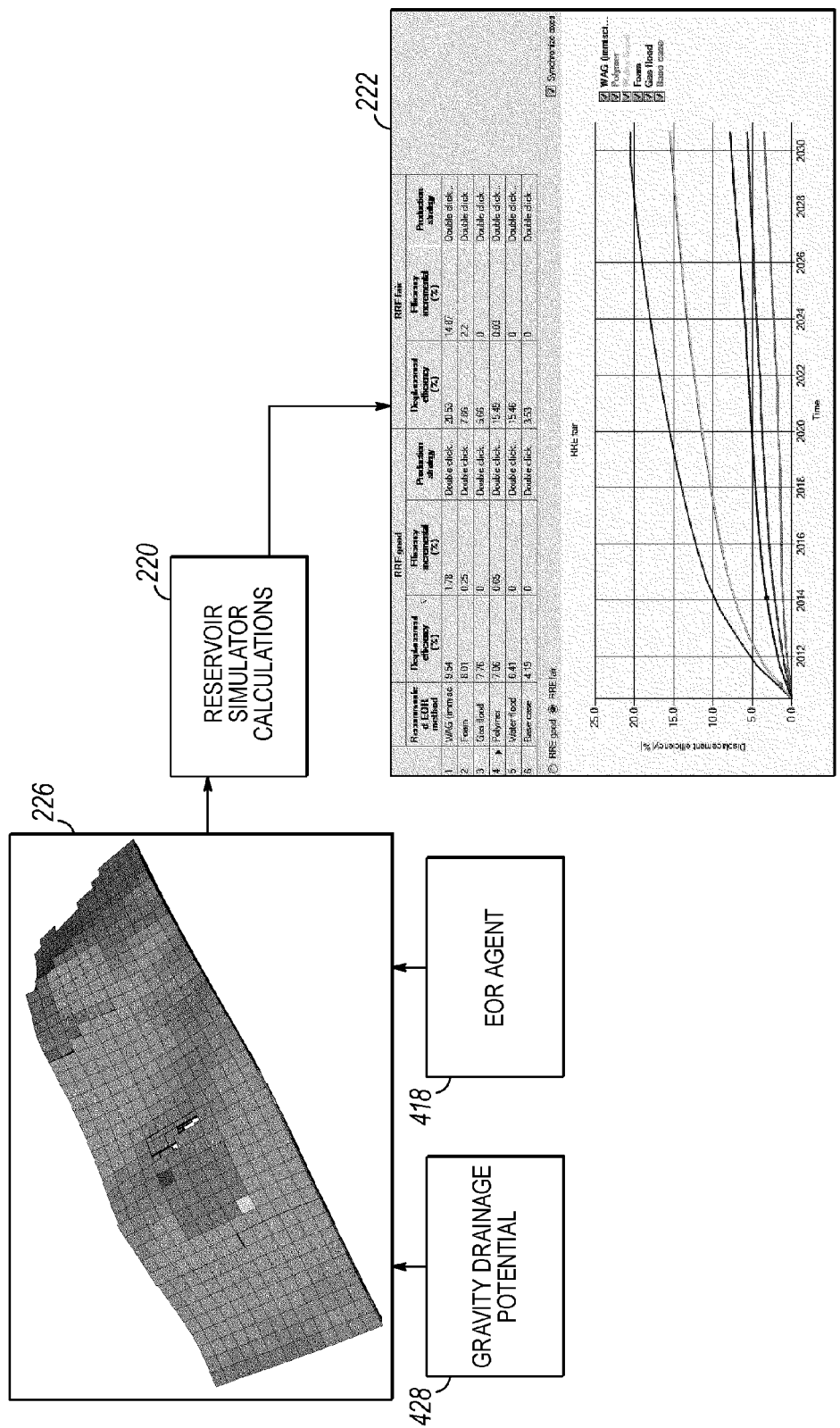

FIG. 12 illustrates in greater detail the operation of blocks 306-310 of FIG. 9 in performing analytical and numerical estimation of local recovery factors for each fracture type and EOR scheme to estimate EOR potential for each EOR scheme. Stored data 420 related to reservoir properties are fed to a data mining algorithm, an analytical simulation 422 and a simplified numerical simulator for each area, from which global LDE as well as matrix and fracture LDE may be obtained. The analytical simulation may be run for each of the matrix and fracture to generate a pore scale ranking and simulation LDE for each of the matrix and fracture systems and for each EOR agent. The numerical simulation evaluates LDE of matrix and fracture systems together for each area and for each EOR agent. Also illustrated is compatibility, macro scale filtering and industry guidance properties that may be generated using the techniques described above. Note that the simulated LDE is generated for both the matrix and fracture (in parenthesis), as well as the integrated systems FIG. 13 illustrates in greater detail the operation of block 312 of FIG. 9 in expanding simulation results to the reservoir sections. Block 312 may be implemented in a similar manner to that described above in connection with elements 220, 222 and 226 (illustrated in FIGS. 7 and 8), with the addition of an input of gravity drainage (GD) potential 428.

FIGS. 14-18 next illustrate the detailed classification of NFR reservoirs, which may be based, in part on the classifications described in Geological Analysis of Naturally Fractured Reservoirs, Ronald A. Nelson, Second Edition 2001, as well as the quantification of matrix recoveries. FIG. 14, described above, outlines the properties associated with each classification, while FIGS. 15-18 respectively illustrate the analysis performed to quantify matrix recoveries for the FD, FMD, MFD and MD fracture types.

Figure 15:
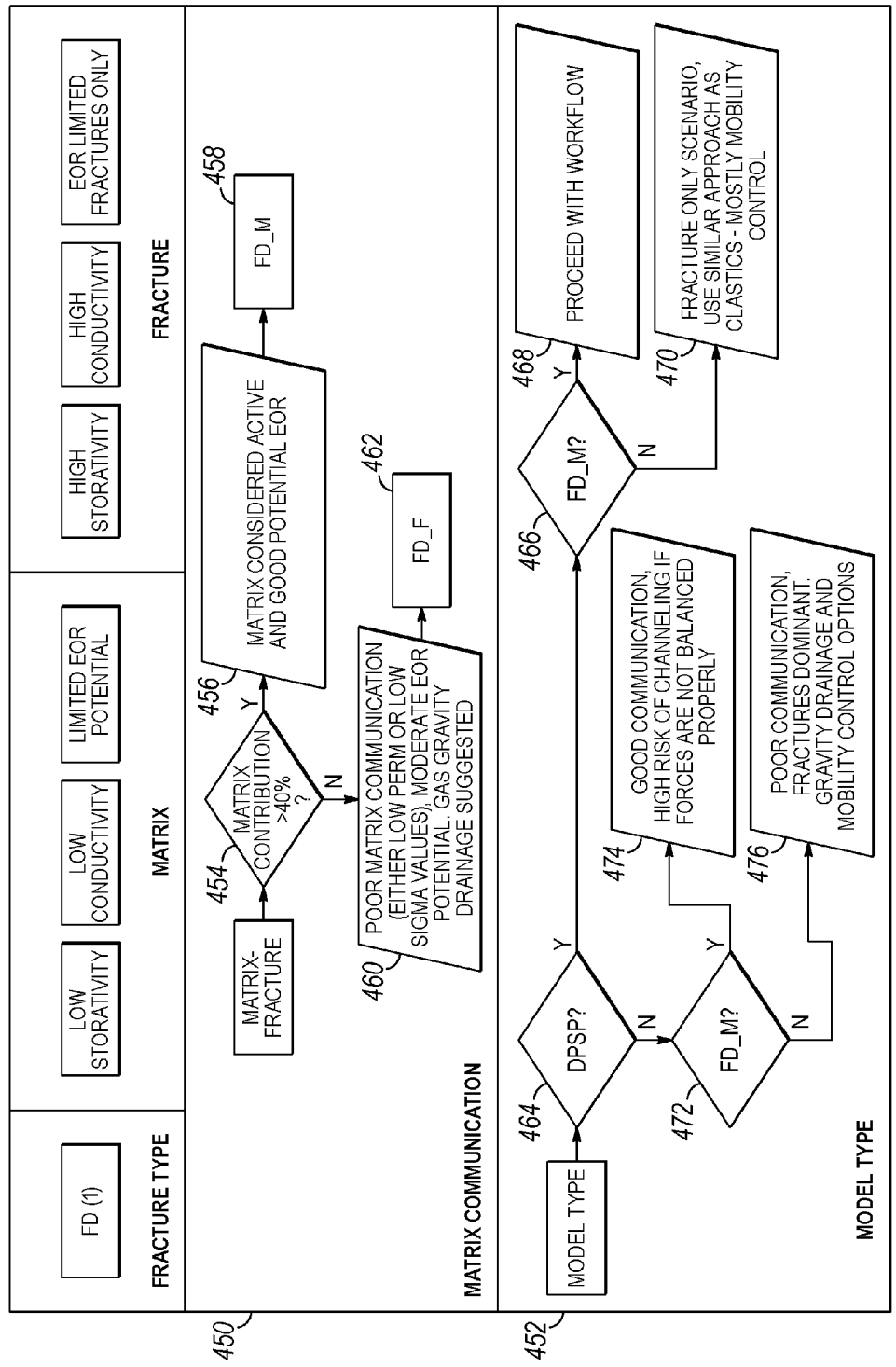
FIGS. 15-18 respectively illustrate analysis operations performed to quantify matrix recoveries for the FD, FMD, MFD and MD fracture types referenced in FIG. 14.

As shown in FIG. 15, for example, for the FD fracture type, block 450 is used to analyze the matrix communication, i.e., block 450 quantifies the relative contribution of the matrix blocks to the overall recovery allowing for the refined classification of NFR regions. Block 452 is used to analyze the model type, i.e., to describe the EOR potential identification for each fracture type based on matrix-fracture, fracture-fracture and matrix-matrix communication.

In block 450, the matrix contribution is analyzed in block 454, and if the matrix contribution is found to be over a threshold, e.g., 40%, the matrix is considered to be active and associated with a good potential for EOR (block 456), leading to a classification of FD_M (fracture dominated, matrix activated) (block 458). If not, poor matrix communication exists (e.g., either due to low permeability or low sigma values), with only a moderate EOR potential, and with gas gravity drainage suggested (block 460), leading to a classification of FD_F (fracture dominated, fracture only active) (block 462).

In block 452, the model type is analyzed first by determining in block 464 whether a dual porosity single permeability (DPSP) condition exists, and if so, determining in block 466 whether the matrix is activated (i.e., an FD_M classification). If so, the aforementioned workflow may be continued (block 468), otherwise, a fracture only scenario is determined, and a similar approach as described above may be used (i.e., no additional analysis may be needed) (block 470). Returning to block 464, if the DPSP condition does not exist, block 472 determines whether the matrix is activated (i.e., an FD_M classification), and if so, indicates that good communication exists and there is a high risk of channeling if forces are not balanced properly (block 474). Otherwise, poor communication exists and fractures are dominant, suggesting gravity drainage and mobility control options (block 476).

Figure 16:
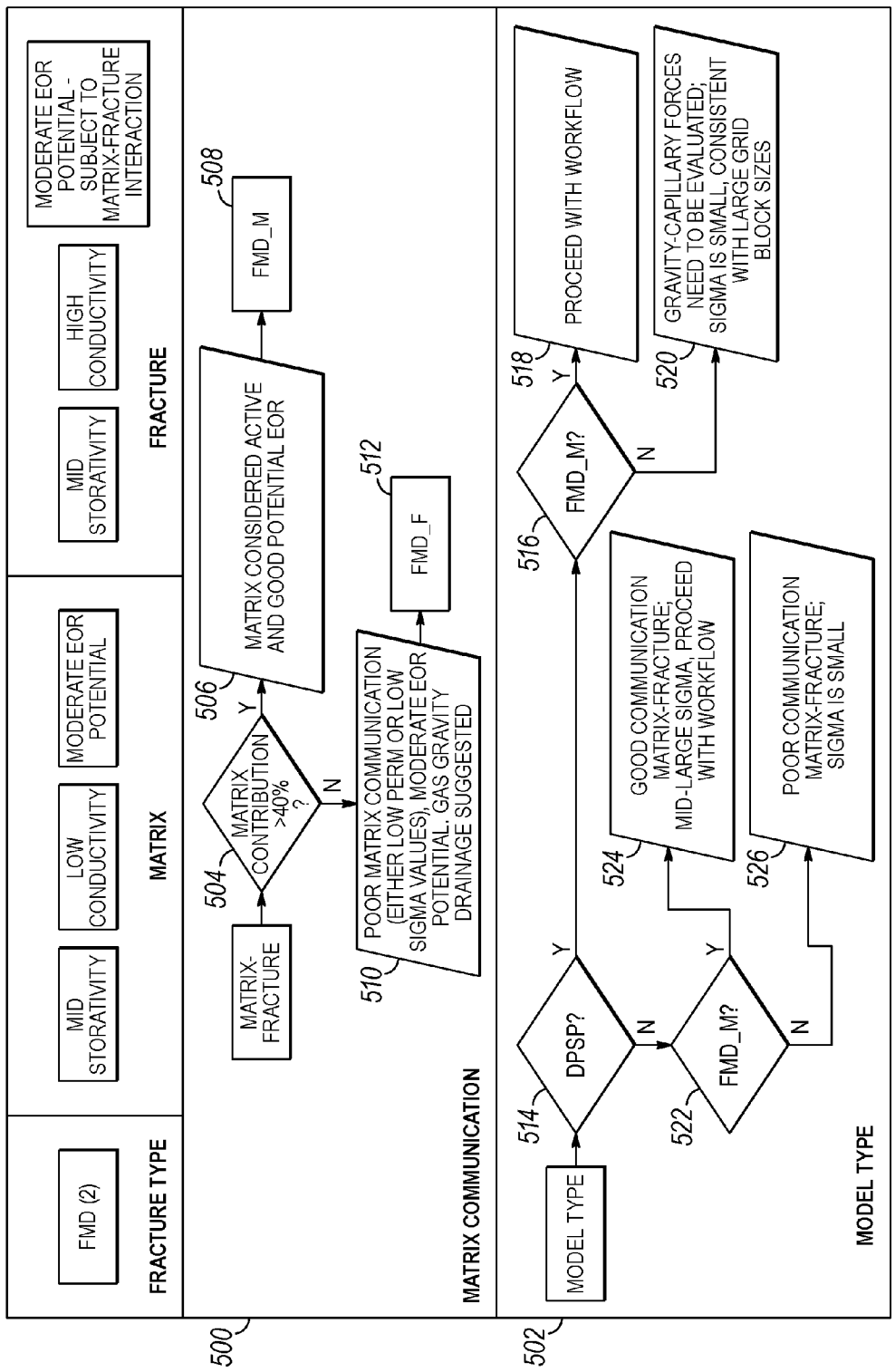

Likewise, for the FMD fracture type, as shown in FIG. 16, block 500 is used to analyze the matrix communication, while block 502 is used to analyze the model type. In block 500, the matrix contribution is analyzed in block 504, and if the matrix contribution is found to be over a threshold, e.g., 40%, the matrix is considered to be active and associated with a good potential for EOR (block 506), leading to a classification of FMD_M (fracture matrix dominated, matrix activated) (block 508). If not, poor matrix communication exists (e.g., either due to low permeability or low sigma values), with only a moderate EOR potential, and with gas gravity drainage suggested (block 510), leading to a classification of FMD_F (fracture matrix dominated, fracture only active) (block 512).

In block 502, the model type is analyzed first by determining in block 514 whether a dual porosity single permeability (DPSP) condition exists, and if so, determining in block 516 whether the matrix is activated (i.e., an FMD_M classification). If so, the aforementioned workflow may be continued (block 518), otherwise, an indication exists that gravity-capillary forces need to be evaluated, and that sigma is small, consistent with large grid block sizes (block 520). Returning to block 514, if the DPSP condition does not exist, block 522 determines whether the matrix is activated (i.e., an FMD_M classification), and if so, indicates that good communication exists, a mid-large sigma exists, and that the workflow should be proceeded with (block 524). Otherwise, poor communication exists and sigma is small (block 526).

Figure 17:
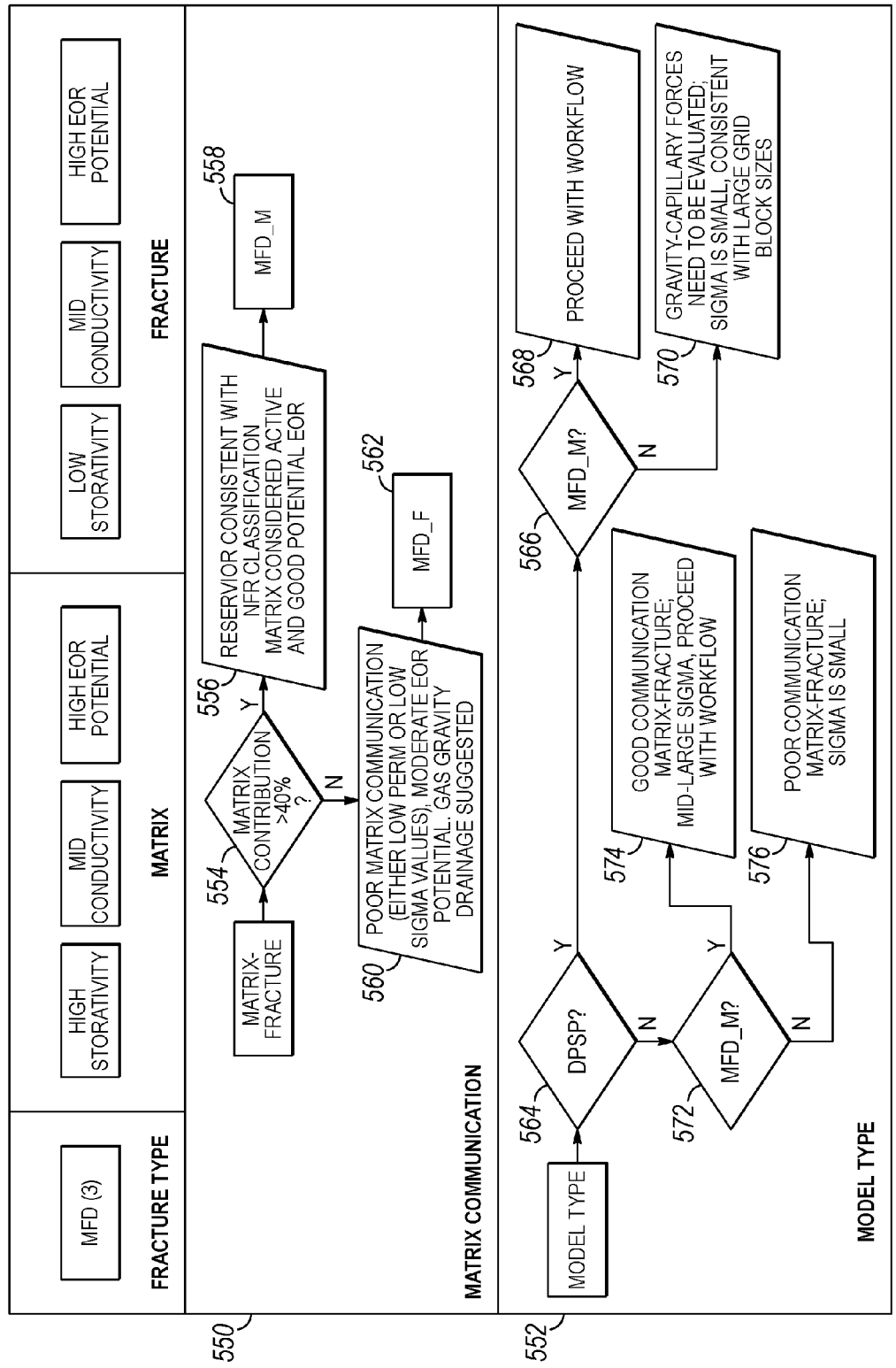

For the MFD fracture type, as shown in FIG. 17, block 550 is used to analyze the matrix communication, while block 552 is used to analyze the model type. In block 550, the matrix contribution is analyzed in block 554, and if the matrix contribution is found to be over a threshold, e.g., 40%, the reservoir is considered to be consistent with an NFR classification, and the matrix is considered to be active and associated with a good potential for EOR (block 556), leading to a classification of MFD_M (matrix fracture dominated, matrix activated) (block 558). If not, poor matrix communication exists (e.g., either due to low permeability or low sigma values), with only a moderate EOR potential, and with gas gravity drainage suggested (block 560), leading to a classification of MFD_F (matrix fracture dominated, fracture only active) (block 562).

In block 552, the model type is analyzed first by determining in block 564 whether a dual porosity single permeability (DPSP) condition exists, and if so, determining in block 566 whether the matrix is activated (i.e., an MFD_M classification). If so, the aforementioned workflow may be continued (block 568), otherwise, an indication exists that gravity-capillary forces need to be evaluated, and that sigma is small, consistent with large grid block sizes (block 570). Returning to block 564, if the DPSP condition does not exist, block 572 determines whether the matrix is activated (i.e., an MFD_M classification), and if so, indicates that good communication exists, a mid-large sigma exists, and that the workflow should be proceeded with (block 574). Otherwise, poor communication exists and sigma is small (block 576).

Figure 18:
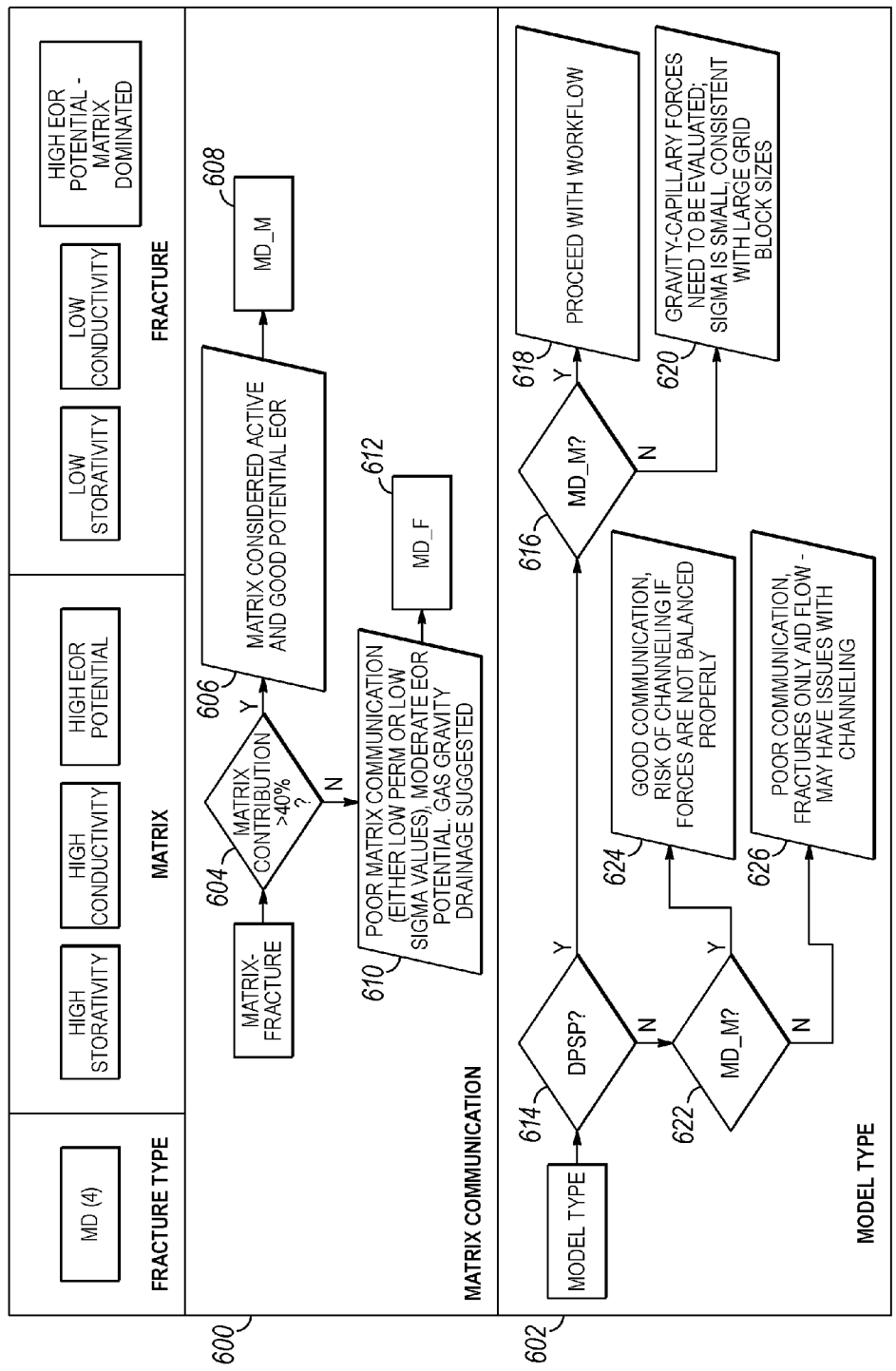

For the MD fracture type, as shown in FIG. 18, block 600 is used to analyze the matrix communication, while block 602 is used to analyze the model type. In block 600, the matrix contribution is analyzed in block 604, and if the matrix contribution is found to be over a threshold, e.g., 40%, the matrix is considered to be active and associated with a good potential for EOR (block 606), leading to a classification of MD_M (matrix dominated, matrix activated) (block 608). If not, poor matrix communication exists (e.g., either due to low permeability or low sigma values), with only a moderate EOR potential, and with gas gravity drainage suggested (block 610), leading to a classification of MD_F (matrix dominated, fracture only active) (block 612).

In block 602, the model type is analyzed first by determining in block 614 whether a dual porosity single permeability (DPSP) condition exists, and if so, determining in block 616 whether the matrix is activated (i.e., an MD_M classification). If so, the aforementioned workflow may be continued (block 618), otherwise, an indication exists that gravity-capillary forces need to be evaluated, and that sigma is small, consistent with large grid block sizes (block 620).

Returning to block 614, if the DPSP condition does not exist, block 622 determines whether the matrix is activated (i.e., an MD_M classification), and if so, indicates that good communication exists, but that a risk of channeling exists if forces are not balanced properly (block 624). Otherwise, poor communication exists and fractures only aid flow, and that channeling may be a concern (block 626).

Thus, as may be appreciated from FIGS. 15-18, up to eight different fracture types may be defined in some embodiments of the invention.

Figure 19:
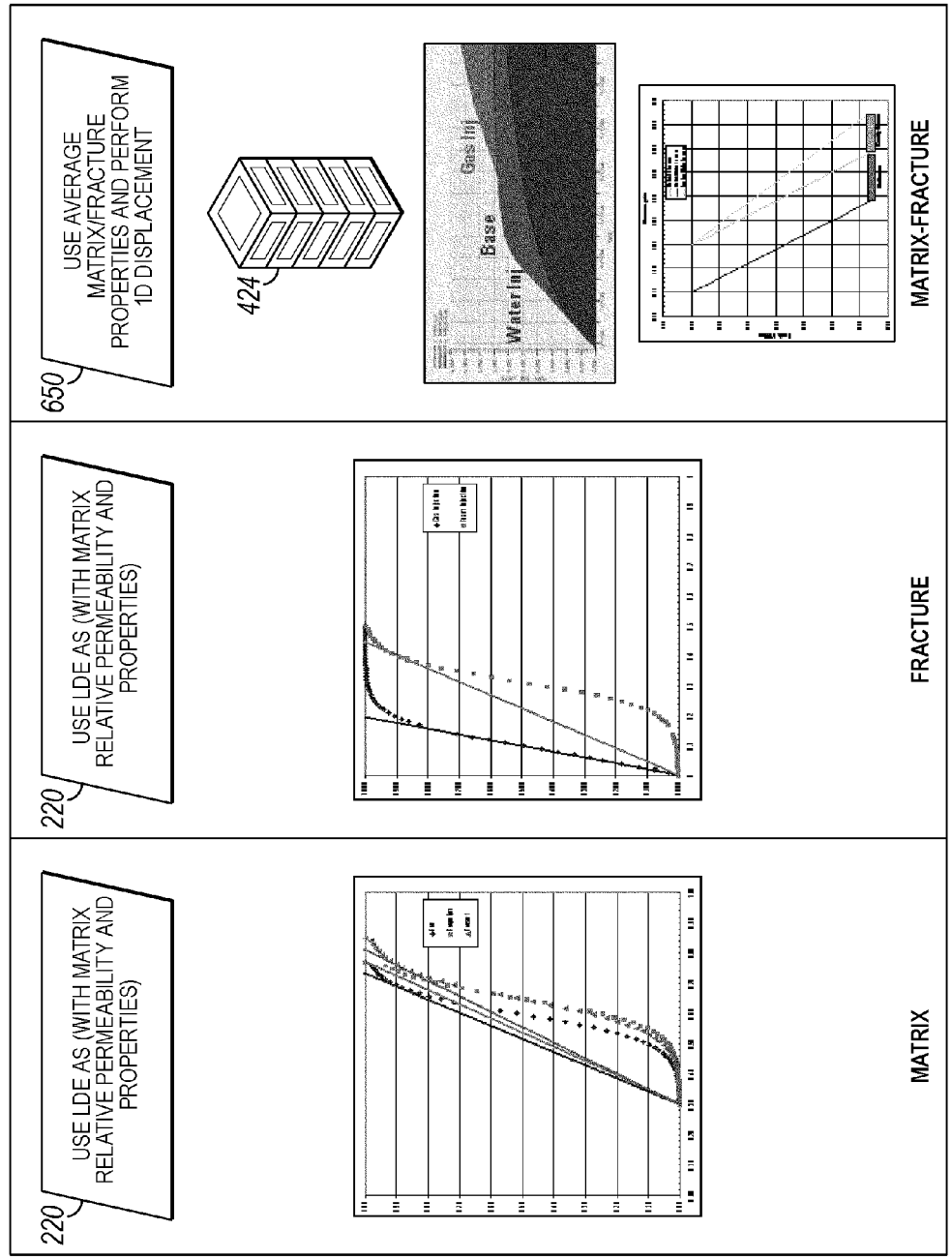
FIG. 19 illustrates a detailed analytical-numerical combined approach to determine local displacement efficiency (LDE) on matrix and fracture systems.

Next, reference to FIG. 19, this figure illustrates a detailed analytical-numerical combined approach to determine local displacement efficiency (LDE) on matrix and fracture systems. Block 220, used for both the individual matrix and fracture systems, is described above, and is applied on both matrix and fractures in this workflow to estimate local displacements for each EOR type independently. Block 650 illustrates a combined approach to estimate the local displacement efficiency on both matrix and fracture combined using a 1D numerical simulation and representative matrix/fracture properties including gravity drainage.

FIGS. 20A-20B show a summary of the analysis described above along with the identification of EOR potential for each fracture type (FD, FMD, MFD and MD) based on matrix-fracture interaction, oil distribution and dominant NFR forces balance. The fracture type, M-F communication and model columns (DPSP or dual porosity/dual permeability (DPDP)) present a total of 16 different scenarios. For each scenario, the process column refers to the gravity displacement potential and displacement of each fracture type, while the macroscale column refers to the type of workflow to be used. Workflow A refers to the non-NFR workflow described above, while Workflow B refers to the NFR workflow described herein. The MLDE and FLDE columns refer to the LDE for the matrix and fracture systems, respectively, while GD refers to the gravity displacement potential.

Among other features, the NFR workflow described herein may implement a dynamic classification of fractures based at least in part on the activity of the matrix system in a reservoir. In addition, the herein-described NFR workflow may in some embodiments simulate the matrix and fracture systems together to enable the interaction of these two systems to be factored into the analysis of each EOR scheme under evaluation, including all relevant recovery mechanisms for NFR reservoirs such as gravity drainage.

While particular embodiments have been described, it is not intended that the invention be limited thereto, as it is intended that the invention be as broad in scope as the art will allow and that the specification be read likewise. It will therefore be appreciated by those skilled in the art that yet other modifications could be made without deviating from its spirit and scope as claimed.

What is claimed is:

1. A method for generating an estimation of an incremental recovery for an Enhanced Oil Recovery (EOR) process performed on a naturally-fractured reservoir, the method comprising:
using at least one processor, classifying the naturally-fractured reservoir based upon a set of reservoir properties associated with the naturally-fractured reservoir, including determining a classification for each of a plurality of cells in a reservoir model of the naturally-fractured reservoir, each classification assigned from one of a plurality of predetermined fracture types based upon fracture and matrix systems of the reservoir;
using the at least one processor, running one or more computer simulations with the reservoir model to simulate for each of the plurality of fracture types and each of a plurality of EOR processes matrix and fracture systems for the reservoir together to account for interaction of the matrix and fracture systems; and
generating an estimation of the incremental recovery for at least one EOR process among the plurality of EOR processes based on the classification of the naturally-fractured reservoir and the one or more computer simulations.

2. The method of claim 1, further comprising selecting an EOR process based on the set of reservoir properties associated with the naturally-fractured reservoir, wherein selecting the EOR process comprises:
consulting a smart guide system to determine if EOR potential exists in connection with the set of reservoir properties; and
on the condition that EOR potential does exist in connection with the set of reservoir properties, consulting at least one EOR database and identifying an EOR process based on the set of reservoir properties.

3. The method of claim 2, wherein generating the estimation comprises calculating an incremental recovery per reservoir type in response to the EOR process and in response to the set of reservoir properties, the incremental recovery representing an estimation of the incremental recovery that can be expected from the selected EOR process.

4. The method of claim 3, further comprising:
generating qualitative EOR guidance in response to the estimate of the incremental recovery; and
generating quantitative EOR guidance in response to the estimate of the incremental recovery.

5. The method of claim 4, further comprising generating a reservoir field improvement design for the naturally-fractured reservoir in response to the qualitative EOR guidance and the quantitative EOR guidance.

6. The method of claim 1, further comprising determining incremental recovery of an overall reservoir physical system, based on both a matrix system and a fracture system for the reservoir, under various EOR schemes.

7. The method of claim 1, wherein determining the classification includes assigning a fracture dominated, fracture matrix dominated, matrix fracture dominated, or matrix dominated fracture type to each of the plurality of cells.

8. The method of claim 7, wherein determining the classification is based at least in part on activity of a matrix system.

9. The method of claim 1, wherein running the one or more computer simulations includes simulating local displacement efficiency (LDE) for the matrix and fracture systems.

10. The method of claim 9, wherein simulating LDE includes generating a matrix LDE, a fracture LDE and a global LDE for a reservoir model of the reservoir.

11. The method of claim 9, wherein simulating LDE includes simulating gravity drainage potential when simulating LDE.

12. An apparatus, comprising:
at least one processor; and
program code configured upon execution by the at least one processor to generate an estimation of an incremental recovery for an Enhanced Oil Recovery (EOR) process performed on a naturally-fractured reservoir by classifying the naturally-fractured reservoir based upon a set of reservoir properties associated with the naturally-fractured reservoir, and generating an estimation of the incremental recovery for at least one EOR process based on the classification of the naturally-fractured reservoir, wherein the program code is configured to classify the naturally-fractured reservoir by determining a classification for each of a plurality of cells in a reservoir model of the naturally-fractured reservoir, each classification assigned from one of a plurality of predetermined fracture types based upon fracture and matrix systems of the reservoir, wherein the program code is configured to run one or more computer simulations with the reservoir model to simulate for each of the plurality of fracture types and each of a plurality of EOR processes matrix and fracture systems for the reservoir together to account for interaction of the matrix and fracture systems, wherein the at least one EOR process is among the plurality of EOR processes, and wherein the program code is configured to generate the estimation of the incremental recovery for the at least one EOR process based upon the one or more computer simulations.

13. The apparatus of claim 12, wherein the program code is configured to generate the estimation by calculating an incremental recovery per reservoir type in response to the EOR process and in response to the set of reservoir properties, the incremental recovery representing an estimation of the incremental recovery that can be expected from the selected EOR process.

14. The apparatus of claim 12, wherein the program code is further configured to determine incremental recovery of an overall reservoir physical system, based on both a matrix system and a fracture system for the reservoir, under various EOR schemes.

15. The apparatus of claim 12, wherein the program code is configured to determine the classification by assigning a fracture dominated, fracture matrix dominated, matrix fracture dominated, or matrix dominated fracture type to each of the plurality of cells.

16. The apparatus of claim 15, wherein the program code is configured to determine the classification is based at least in part on activity of a matrix system.

17. A program product, comprising:
a non-transitory computer readable medium; and
program code stored on the computer readable medium and configured upon execution by at least one processor to generate an estimation of an incremental recovery for an Enhanced Oil Recovery (EOR) process performed on a naturally-fractured reservoir by classifying the naturally-fractured reservoir based upon a set of reservoir properties associated with the naturally-fractured reservoir, and generating an estimation of the incremental recovery for at least one EOR process based on the classification of the naturally-fractured reservoir, wherein the program code is configured to classify the naturally-fractured reservoir by determining a classification for each of a plurality of cells in a reservoir model of the naturally-fractured reservoir, each classification assigned from one of a plurality of predetermined fracture types based upon fracture and matrix systems of the reservoir, wherein the program code is configured to run one or more computer simulations with the reservoir model to simulate for each of the plurality of fracture types and each of a plurality of EOR processes matrix and fracture systems for the reservoir together to account for interaction of the matrix and fracture systems, wherein the at least one EOR process is among the plurality of EOR processes, and wherein the program code is configured to generate the estimation of the incremental recovery for the at least one EOR process based upon the one or more computer simulations.

\* \* \* \* \*